(12) United States Patent
Whatmough et al.

(10) Patent No.: US 9,933,466 B2
(45) Date of Patent: Apr. 3, 2018

(54) APPARATUS AND METHOD FOR DETECTING A RESONANT FREQUENCY GIVING RISE TO AN IMPEDANCE PEAK IN A POWER DELIVERY NETWORK

(71) Applicant: ARM Limited, Cambridge (GB)

(72) Inventors: Paul Nicholas Whatmough, Cambridge (GB); Shidhartha Das, Upper Cambourne (GB); David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 112 days.

(21) Appl. No.: 15/172,101

(22) Filed: Jun. 2, 2016

(65) Prior Publication Data

US 2017/0030954 A1    Feb. 2, 2017

(30) Foreign Application Priority Data

Jul. 30, 2015 (GB) .................................. 1513383.8

(51) Int. Cl.
*G01R 27/26* (2006.01)
*G01R 23/07* (2006.01)
(Continued)

(52) U.S. Cl.
CPC ............. *G01R 23/07* (2013.01); *G01R 23/02* (2013.01); *G01R 23/04* (2013.01); *G01R 27/04* (2013.01); *G01R 27/26* (2013.01); *G01R 27/32* (2013.01)

(58) Field of Classification Search
CPC ........ G01R 23/00; G01R 23/02; G01R 23/04; G01R 23/06; G01R 23/07; G01R 23/08;
(Continued)

(56) References Cited

U.S. PATENT DOCUMENTS 5,563,478 A * 10/1996 Suganuma ............. H02N 2/142
                                                    310/316.02
6,781,355 B2 * 8/2004 Gauthier ................... G06F 1/26
                                                    323/233
(Continued)

OTHER PUBLICATIONS

UKIPO Search Report; GB 1513383.8; dated Jan. 27, 2016.
(Continued)

*Primary Examiner* — Hoai-An D Nguyen
(74) *Attorney, Agent, or Firm* — Pramudji Law Group PLLC; Ari Pramudji

(57) ABSTRACT

An apparatus and method are provided for detecting a resonant frequency giving rise to an impedance peak in a power delivery network used to provide a supply voltage. The apparatus includes resonant frequency detection circuitry that comprises test frequency control circuitry and a loading circuit. The test frequency control circuitry is arranged to generate control signals to indicate a sequence of test frequencies. A loading circuit is controlled by the control signals and operates from the supply voltage. In particular, in response to each test frequency indicated by the control signals, the loading circuit draws a duty-cycled current load through the power delivery network at that test frequency. Operation of the loading circuit produces a measurable property whose value varies in dependence on the supply voltage, thus enabling the resonant frequency to be determined from a variation in the value of that measurable property.

19 Claims, 18 Drawing Sheets

(51) Int. Cl.
*G01R 23/02* (2006.01)
*G01R 23/04* (2006.01)
G01R 27/04 (2006.01)
G01R 27/32 (2006.01)

(58) Field of Classification Search
CPC ........ G01R 27/00; G01R 27/02; G01R 27/04; G01R 27/26; G01R 27/32
USPC ...... 324/600, 629, 633, 76.11, 76.12, 76.19; 702/1, 57, 66, 75, 76
See application file for complete search history.

(56) References Cited

U.S. PATENT DOCUMENTS

| | | | | |
|---|---|---|---|---|
| 7,886,431 B2* | 2/2011 | Weir | ............... | H01L 23/66 29/831 |
| 2004/0165406 A1* | 8/2004 | Gauthier | ............... | H02J 1/02 363/39 |
| 2005/0111125 A1* | 5/2005 | Chung | ............... | G01H 13/00 360/31 |
| 2008/0258700 A1* | 10/2008 | Block | ............... | H03L 7/0805 323/318 |
| 2013/0030741 A1 | 1/2013 | Iorga | | |
| 2015/0089315 A1 | 3/2015 | Alcocer Ochoa et al. | | |
| 2015/0137864 A1 | 5/2015 | Whatmough et al. | | |

OTHER PUBLICATIONS

Das, et al.; Modeling and Characterization of the System-Level Power Delivery Network for a Dual-Core ARM Cortex-A57 Cluster in 28nm CMOS; International Symposium on Low Power Electronics and Design (ISLPED); Jul. 22, 2015.

Whatmough, et al.; An All-Digital Power-Delivery Monitor for Analysis of a 28nm Dual-Core ARM Cortex-A57 Cluster; 2015 IEEE International Solid-State Circuits Conference—(ISSCC) Digest of Technical Papers; Feb. 22, 2015.

Kim, et al.; A Supply-Noise Sensitivity Tracking PLL in 32 nm SOI Featuring a Deep Trench Capacitor Based Filter; IEEE Journal of Solid-State Circuits; vol. 49, No. 4; Apr. 4, 2014.

Klokotov, et al.; Distributed Modeling and Characterization of on-Chip/System Level PDN and Jitter Impact; DesignCon 2014; Jan. 29, 2014.

Smith, et al.; System Power Distribution Network Theory and Performance with Various Noise Current Stimuli Including Impacts on Chip Level Timing; 2009 IEEE Custom Integrated Circuits Conference; Sep. 13, 2009.

* cited by examiner

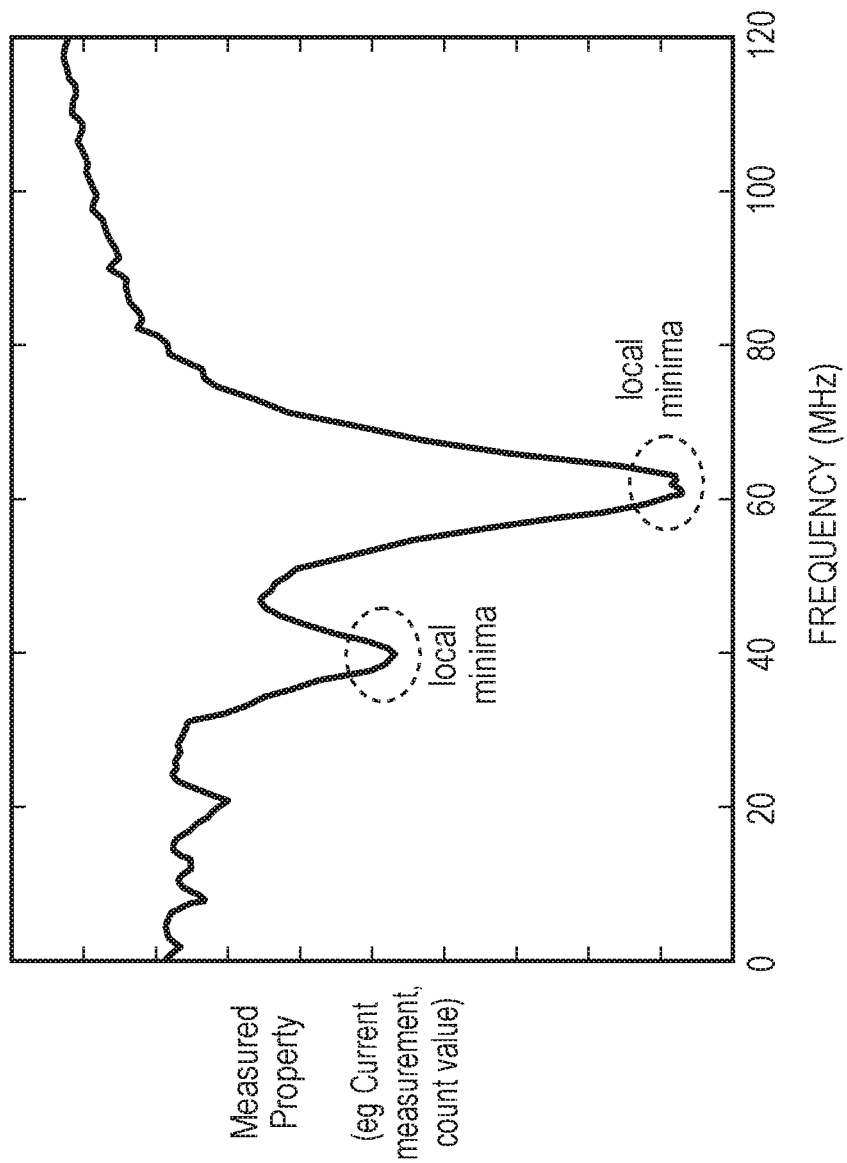

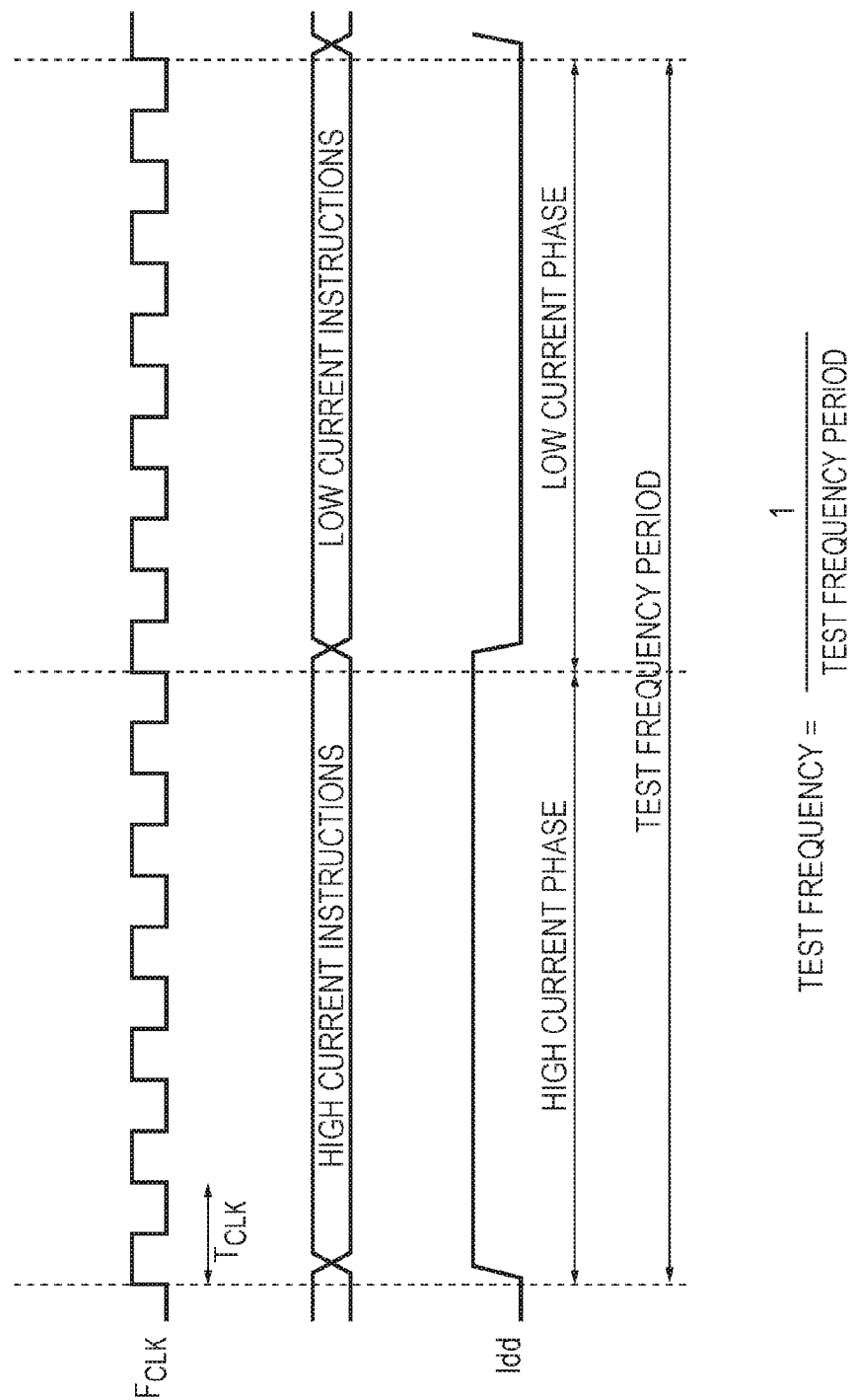

APPARATUS AND METHOD FOR DETECTING A RESONANT FREQUENCY GIVING RISE TO AN IMPEDANCE PEAK IN A POWER DELIVERY NETWORK

CROSS-REFERENCE TO RELATED APPLICATIONS

This application claims priority to United Kingdom Patent Application No. GB 1513383.8, filed 2015 Jul. 30, and titled AN APPARATUS AND METHOD FOR DETECTING A RESONANT FREQUENCY GIVING RISE TO AN IMPEDANCE PEAK IN A POWER DELIVERY NETWORK, the entire disclosure of which is herein incorporated by reference.

BACKGROUND

The present technique relates to an apparatus and method for detecting a resonant frequency giving rise to an impedance peak in a power delivery network.

When designing power delivery networks used to distribute a supply voltage to components of a data processing system, one or more resonant frequencies can occur within the power delivery network that can give rise to corresponding impedance peaks. When such an impedance peak occurs, this can give rise to a corresponding drop in the supply voltage provided to the components, and hence it is important to know the frequencies at which such impedance peaks occur, so as to allow the system incorporating the power delivery network and the various components operating from the supply voltage to be configured to operate taking into account the presence of those impedance peaks.

When designing the power delivery network it is possible to determine where the impedance peaks should appear. However, when the systems incorporating the power delivery network design are manufactured, it has been found that the resonant frequencies, and hence the impedance peaks, may differ from the values calculated at design time, and accordingly it is desirable to seek to measure the resonant frequencies in the manufactured system. In particular, if the resonant frequencies differ from the values calculated at design time, this can cause significant performance issues, which can result in certain faults arising during operation of the data processing system, for example due to timing errors.

However, known techniques for seeking to determine the locations of the impedance peaks within the frequency spectrum suffer from a number of disadvantages. For example, AC supply impedance may be measured using a time-domain approach of measuring a step or impulse response and converting this into a frequency-domain impedance plot. However, this typically requires dedicated voltage sense pins and off-chip measurement circuits such as oscilloscopes, which adds significant cost to the manufacturing test process.

SUMMARY

In an example configuration, the present technique provides an apparatus comprising: a power delivery network to provide a supply voltage to components of the apparatus, the power delivery network having an impedance peak at at least one resonant frequency; and resonant frequency detection circuitry comprising: test frequency control circuitry to generate control signals to indicate a sequence of test frequencies; and a loading circuit operating from said supply voltage, responsive to each test frequency indicated by the control signals, to draw a duty-cycled current load through the power delivery network at said test frequency, operation of the loading circuit producing a measurable property whose value varies in dependence on the supply voltage such that said at least one resonant frequency is determined from a variation in the value of said measurable property.

In another example configuration, there is provided resonant frequency detection circuitry for detecting a resonant frequency giving rise to an impedance peak in a power delivery network used to provide a supply voltage, comprising: test frequency control circuitry to generate control signals to indicate a sequence of test frequencies; and a loading circuit operating from said supply voltage, responsive to each test frequency indicated by the control signals, to draw a duty-cycled current load through the power delivery network at said test frequency, operation of the loading circuit producing a measurable property whose value varies in dependence on the supply voltage such that said resonant frequency is determined from a variation in the value of said measurable property.

In an additional example configuration, there is provided a method of detecting a resonant frequency giving rise to an impedance peak in a power delivery network used to provide a supply voltage, comprising: generating control signals to indicate a sequence of test frequencies; operating a loading circuit from said supply voltage; and responsive to each test frequency indicated by the control signals, operating the loading circuit to draw a duty-cycled current load through the power delivery network at said test frequency, operation of the loading circuit producing a measurable property whose value varies in dependence on the supply voltage such that said resonant frequency is determined from a variation in the value of said measurable property.

In a yet further example configuration, there is provided an apparatus comprising: power delivery network means for providing a supply voltage to components of the apparatus, the power delivery network means having an impedance peak at at least one resonant frequency; and resonant frequency detection means comprising: test frequency control means for generating control signals to indicate a sequence of test frequencies; and loading circuit means for operating from said supply voltage, and responsive to each test frequency indicated by the control signals, for drawing a duty-cycled current load through the power delivery network at said test frequency, operation of the loading circuit means producing a measurable property whose value varies in dependence on the supply voltage such that said at least one resonant frequency is determined from a variation in the value of said measurable property.

BRIEF DESCRIPTION OF THE DRAWINGS

The present technique will be described further, by way of example only, with reference to embodiments thereof as illustrated in the accompanying drawings, in which:

FIG. 6A schematically illustrates the profile of a measured property produced when operating the resonant frequency detection circuitry of one embodiment.

FIGS. 11A and 11B are diagrams illustrating a resonant frequency detection circuit in accordance with a yet further embodiment;

DESCRIPTION OF EMBODIMENTS

Figure 1:
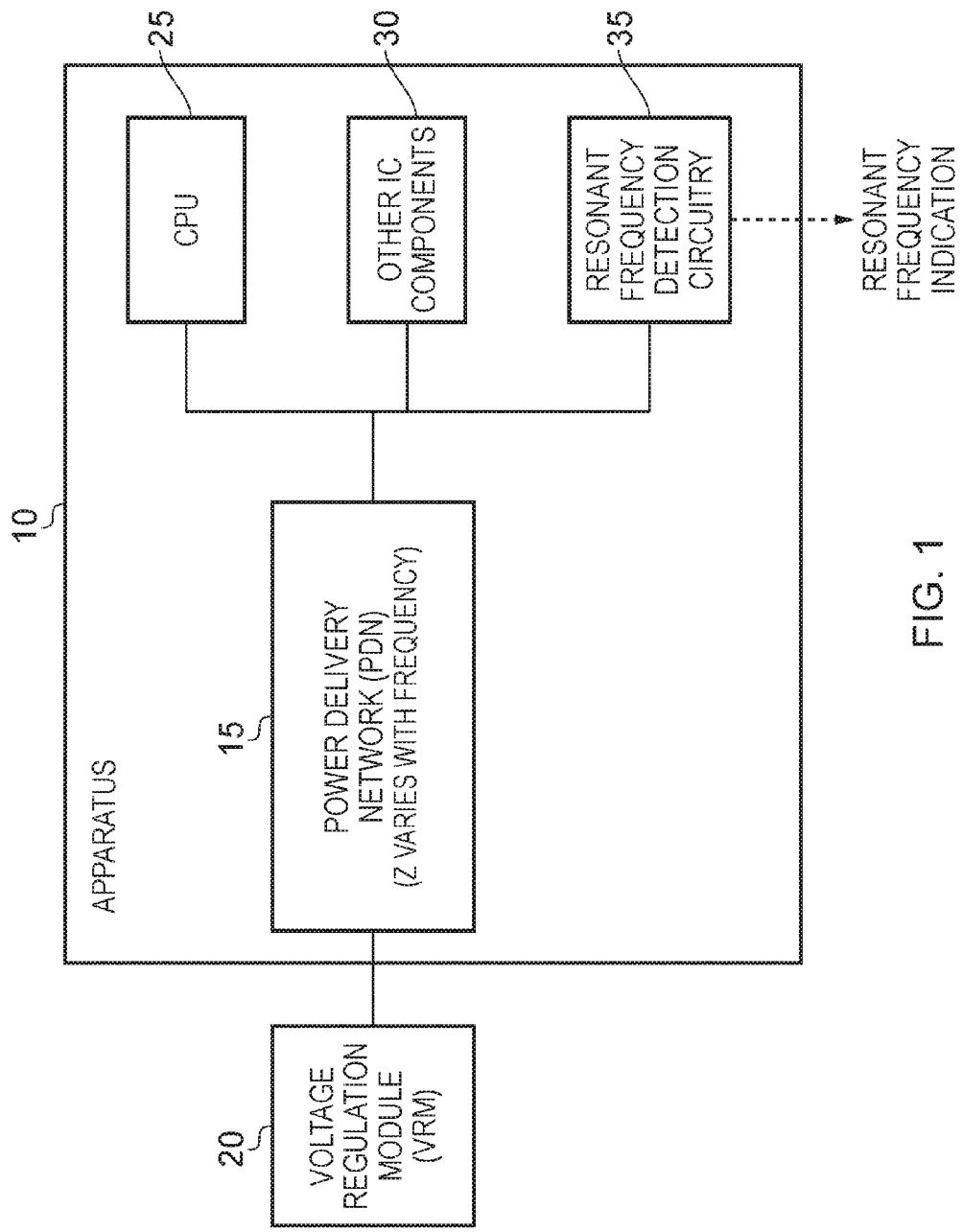
FIG. 1 is a block diagram of an apparatus in accordance with one embodiment.

Before discussing the embodiments with reference to the accompanying figures, the following description of embodiments is provided.

In one embodiment an apparatus is provided that has a power delivery network for providing a supply voltage to components of the apparatus, the power delivery network having an impedance peak at one or more resonant frequencies. In addition, resonant frequency detection circuitry is provided that comprises both a test frequency control circuit and a loading circuit. The test frequency control circuitry generates control signals to indicate a sequence of test frequencies. The chosen test frequencies, and the order in which those test frequencies are included within the sequence, can be varied dependent on embodiment. The order in which the individual test frequencies are included within the sequence is not important. Whilst in one embodiment the sequence may be structured so as for example to specify as the sequence a series of regularly increasing test frequencies, in another embodiment the ordering of the test frequencies within the sequence may be random.

The loading circuit within the resonant frequency detection circuitry is arranged to operate from the supply voltage provided by the power delivery network, and to be responsive to each test frequency indicated by the control signals, to draw a duty-cycled current load through the power delivery network at said test frequency. Accordingly, by cycling through all of the test frequencies indicated by the various control signals produced by the test frequency control circuitry, the loading circuit is caused to operate so as to draw a duty-cycled current load through the power delivery network at a range of different test frequencies. The operation of the loading circuitry produces a measurable property whose value varies in dependence on the supply voltage, and as a result each resonant frequency may be determined by observing the variation in the value of the measurable property.

In particular, by virtue of the resonant frequency detection circuit's ability to draw a duty-cycled current load through the power delivery network at a number of different test frequencies, then in situations where the test frequency matches a resonant frequency causing an impedance peak within the power delivery network, this will cause a consequential drop in the supply voltage, which can be observed via a corresponding change in the measurable property. In one embodiment, the drop in the supply voltage also causes a drop in the current drawn by the loading circuit, and both the drop in the supply voltage and the drop in the current drawn influence the value of the measurable property.

The measurable property can take a variety of forms. For example, in one embodiment the loading circuit can be arranged to directly produce an output signal that forms the measurable property, and hence the value of that output signal can be monitored in order to detect each resonant frequency.

However, in an alternative embodiment it is instead possible to measure a property of a signal present at an interface to the apparatus, and in one particular embodiment the property of a signal at an input to the power delivery network. In one particular embodiment, it has been found that the average current drawn at an input to the power delivery network will have a value that, due to the manner in which the loading circuit operates, will vary in a way that enables the resonant frequencies to be detected. As will be discussed in more detail later, this is entirely non-intuitive, as it might be expected that any average current detection would not exhibit such variations.

There are a number of ways in which each resonant frequency may be determined from the variation in the value of the measurable property. In one embodiment, each resonant frequency is determined to be the test frequency that results in a local extrema in observed values of the measurable property. Considering a plot of the observed measurable property against the test frequency, any local maximums and minimums observed in the value of the measurable property can be considered to be local extrema. Dependent on the form of the measurable property being utilised, the frequencies that match the resonant frequencies of the power delivery network may be those that give rise either to a local minima or a local maximum in the measurable property. In one particular embodiment, each resonant frequency is determined to be the test frequency that results in a local minima in the observed value of the measurable property. Hence, for example, when using the average current drawn at the input to the power delivery network as a measured property, a local minima in that average current will indicate the location of a resonant frequency. Similarly, in one embodiment where the measurable property is generated on chip by the resonant frequency detection circuit, for example in the form of a count value, that count value will reduce as the test frequency approaches one of the resonant frequencies of the power delivery network, and hence a local minima in the count value will indicate the location of a resonant frequency.

The loading circuit can take a variety of forms, but in one embodiment comprises ring oscillator circuitry. In such an embodiment the test frequency control circuitry may be arranged to generate, as the control signals for each test frequency in the sequence, a periodic enable signal for the ring oscillator circuitry that repeats at said test frequency. Hence, in such an embodiment the ring oscillator is turned on and off in a manner that repeats at the associated test frequency, and as a result this causes the loading circuit to draw a duty-cycled current load through the power delivery network at the test frequency, in this embodiment the test frequency being directly represented by the frequency at which the enable signal repeats. This hence provides a very cost effective solution for providing a loading circuit that can draw a duty-cycled current load through the power delivery network at a variety of different test frequencies, as controlled by the periodic enable signal.

In one embodiment, the ring-oscillator circuitry is arranged, when enabled, to generate an oscillating output signal at a frequency higher than the test frequency, and the resonant frequency detection circuitry further comprises measurement circuitry to generate said measurable property whose value is indicative of the frequency of the oscillating output signal. Hence, in such an embodiment, the resonant frequency detection circuitry can itself directly generate the measurable property, hence enabling an on-chip value to be generated that can be used to determine the location of the resonant frequencies.

In particular, in one embodiment, the frequency of the oscillating output signal decreases as the supply voltage decreases, such that when the test frequency at which the enable signal is repeated aligns with one of said at least one resonant frequencies, the measurement circuitry detects a local minima in the measurable property. Hence, since the frequency of the oscillating signal decreases as the supply voltage decreases, then if the duty-cycled current load drawn by the loading circuit matches a resonant frequency, this will cause an impedance spike which will cause the supply voltage to drop, with that drop being detectable by a decrease in the measured frequency of the oscillating output signal.

There are a number of ways of measuring the frequency of the oscillating output signal, but in one embodiment the measurement circuitry is arranged to produce a count value indicative of the number of oscillations of the oscillating output signal occurring during a fixed time interval. The time interval is chosen such that there are multiple cycles of the enable signal, thereby enabling the counter to increment across multiple enable phases. By keeping this time interval constant across multiple test frequencies ensures that the count value thus generated is directly proportional to the frequency of the oscillating output signal. Hence, the apparatus can merely record the count values observed for a variety of different test frequencies, and detect local minima in those count values in order to identify the associated resonant frequencies giving rise to the impedance peaks.

In the above embodiment, the count value can be captured at the end of the fixed time interval and the counter then reset, to enable a new count to be detected for a subsequent test frequency. Hence, clearing of the counter can readily be incorporated in between measurements. In the above embodiment, the number of cycles of the enable signal for each test frequency is chosen such that the time interval for counting is kept effectively constant across multiple test frequencies. There may be small mismatches due to the fact that the time interval may not be an exact integral multiple of the test frequency period. In such cases, by keeping the time interval sufficiently long ensures that errors due to the difference between the actual time interval for counting and the closest integral multiple of the test frequency period is a small fraction of the interval.

In an alternative embodiment, the loading circuit is not a ring oscillator circuit, but instead comprises a shorting circuit which, when enabled, creates a shorting path between the supply voltage and a reference voltage, and the test frequency control circuitry is arranged to generate, as the control signals for each test frequency in the sequence, a periodic enable signal for the shorting circuit that repeats at said test frequency. Since the shorting circuit only creates the shorting path for part of the period at which the enable signal repeats, and is disabled during the remaining part of the enable signal period, the operation of the loading circuit again produces a duty-cycled current load through the power delivery network at the test frequency encoded by the periodic enable signal. A measurable property, for example the average current drawn at an input to the power delivery network, can then be observed in order to detect the location of local extrema indicative of a resonant frequency.

Whilst in the above described embodiments the loading circuit may be a dedicated circuit provided specifically for performing the resonant frequency detection, in an alternative embodiment some general purpose circuitry within the apparatus may instead be used. For example, in one embodiment the loading circuit comprises data processing circuitry to repeat execution of a sequence of instructions at the test frequency, execution of the sequence of instructions causing said duty-cycled current load. The test frequency control circuitry in this embodiment is arranged to generate, as the control signals for each test frequency in the sequence, an operating frequency for the data processing circuitry that causes the execution of the sequence of instructions to be repeated at the test frequency. The data processing circuitry can take a variety of forms, for example a central processing unit (CPU), a graphics processing unit (GPU), etc. During the test operation where the resonant frequencies are being detected, the data processing circuitry is arranged to repeat execution of a particular sequence of instructions that has been designed to produce the required duty-cycled current load. For example, during a first portion of the instruction sequence the instructions may cause operations to be performed within the data processing circuitry that cause a relatively large current to be drawn, whilst in a later stage of the sequence the instructions may cause the data processing circuitry to perform operations that only draw a relatively small current. By repeatedly executing the same sequence of instructions, it is possible to emulate a periodic duty-cycled current load where the large current consuming instructions determines the high-current phase and the low-current phase is determined by the small current consuming instructions. The frequency of the current load, thus generated, is related to the operating frequency by the number of processor cycles required to complete execution of a single sequence of instructions. By appropriate selection of operating frequencies, the test frequency control circuitry can ensure that the execution of the sequence of instructions is repeated at a desired test frequency by the data processing circuit. Hence, again the presence of resonant frequencies will be observable from local extrema in the observed values of the measured property, for example the earlier-mentioned average current drawn at an input to the power delivery network.

In embodiments where the average current observed at an input to the power delivery network is measured in order to detect the resonant frequencies (for example via a current detector coupled to an interface to the input of the power delivery network), additional components may be provided to enable the apparatus to additionally determine the values of the impedance peaks. In particular, in one embodiment the apparatus further comprises voltage detection circuitry to detect variation in the supply voltage during operation of the resonant frequency detection circuitry, and impedance determination circuitry to determine values of the impedance peaks based on the variation in the supply voltage detected by the voltage detection circuitry and the average current observed via said interface. In one particular embodiment, a scaling factor is applied to the average current measured at the input to the power delivery network in order to give a measure of the average current that would be drawn through the loading circuit, with that information being used in combination with the detected variation in the supply voltage to determine the corresponding impedance, and accordingly the values of the impedance peaks.

The test frequency control circuitry can be arranged in a variety of ways, but in one embodiment is arranged such that the generated control signals are independent of variation in the supply voltage. Hence, for example, in one embodiment the frequency of the control signals is independent of variation in the supply voltage. This could for example be achieved by operating the test frequency control circuitry from a filtered version of the supply voltage provided by the power delivery network, but in an alternative embodiment the test frequency control circuitry is operated from a further supply voltage that is separate from the supply voltage provided by the power delivery network. In one particular embodiment, this further supply voltage will be provided solely for use by the test frequency control circuitry. The test frequency control circuitry of one embodiment has a very low current consumption and thus does not cause noise transients of a similar magnitude to those observed by the regular power delivery network. Hence, this further supply voltage can readily be retained as a clean supply voltage to supply current to the test frequency control circuitry.

The test frequency control circuitry can take a variety of forms but in one embodiment comprises a phase-locked loop (PLL) circuit. This provides a cost-effective mechanism for implementing the test frequency control circuitry. In particular, it is often the case that an existing PLL within the apparatus can be reused to perform the functions required of the test frequency control circuitry.

In one embodiment, the components that operate from the supply voltage provided by the power delivery network are contained within an integrated circuit of the apparatus. Furthermore, in one embodiment the resonant frequency detection circuit can be entirely provided by components within the integrated circuit, hence providing an elegant on-chip mechanism for detecting resonant frequencies.

Whatever form the measurable property takes, it is desirable to ensure that the value of the measurable property taken is reliable. In one embodiment, power supply oscillations due to the duty-cycled current load build up over time until they lead to sustained oscillations. In one embodiment, in order to compensate for this, the test frequency control circuitry is arranged, for each test frequency, to cause the loading circuit to draw the duty-cycled current load for multiple cycles of the test frequency, and an averaging effect is applied to the value of the measurable property observed during said multiple cycles.

The averaging effect can take a variety of forms. For example, it may be implemented by simply averaging the observed values of the measurable property over multiple cycles of the test frequency until the average approaches an asymptote. Alternatively other approaches could be taken such as: (i) comparing the value observed for two successive cycles, and when they are no longer significantly different determining that the average value has been observed; (ii) discarding the values observed for the first few cycles of the test frequency and then averaging the values observed over a fewer number of cycles; or (iii) waiting for a few cycles before taking a reading of the value of the measurable property to allow for the oscillations to build up (a discrete value could then be taken as the required "average" value, or an averaging of the values over several subsequent cycles could be taken). In any case the average should approach an asymptote showing that the change in the average is continuously decreasing until the change is within the desired accuracy.

Particular embodiments will now be described with reference to the Figures.

FIG. 1 is a block diagram showing an apparatus 10 in accordance with one embodiment. A power delivery network 15 is used to provide a supply voltage to a variety of components within the apparatus, for example a CPU 25 and/or other components 30. In one embodiment, all of these various components are provided within an integrated circuit that is provided with a power supply via the power delivery network 15.

The power delivery network (PDN) 15 receives an input power supply via a voltage regulation module (VRM) 20, which may for example be connected to a battery or a mains power supply. When the various components connected to the PDN draw current, this can trigger certain resonant frequencies within the PDN that give rise to impedance peaks, which in turn can cause relatively large supply voltage noise transients. In particular, droops in the supply voltage can be observed when those resonant frequencies are excited, which can impact the performance of the apparatus. When designing the PDN, the resonant frequencies and associated impedance peaks can be modelled, but when the apparatus 10 is manufactured it is also important to perform a manufacturing test to determine whether the PDN is behaving as modelled, and in particular whether the resonant frequencies and associated impedance peaks match the expected theoretical determination. If they do not, this can indicate faults in the PDN, and can result in a significant reduction in the performance of the components within the apparatus, such as the on-chip components operating from the supply voltage provided by the PDN.

In one embodiment as shown in FIG. 1, resonant frequency detection circuitry 35 can be provided within the apparatus to detect the resonant frequencies giving rise to impendence peaks, hence allowing a ready comparison of the resonant frequencies within the apparatus with the expected resonant frequencies. In one embodiment, such a resonant frequency detection circuit can allow rapid and automated characterisation of AC power supply resonances on-chip.

Figure 2A:
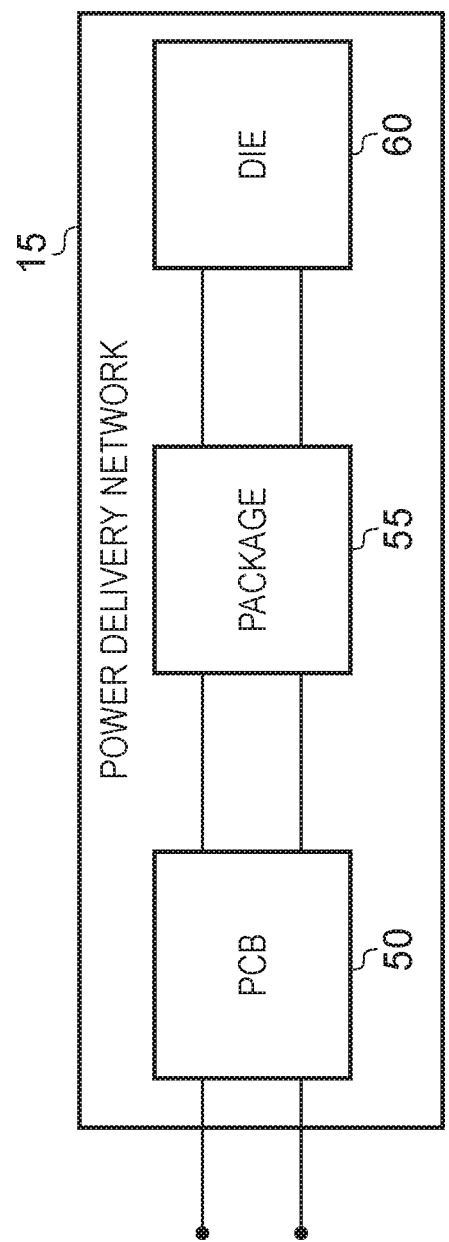
FIGS. 2A and 2B illustrate various components forming the power delivery network in accordance with one embodiment.

The impedance peaks at certain resonant frequencies occur due to interactions between various components forming the power delivery network. FIG. 2A schematically illustrates component parts of the power delivery network 15. In this embodiment, it is assumed that the various integrated circuit components are provided within a silicon die 60, that is then typically mounted within a package 55 that in turn is connected to a printed circuit board (PCB) 50. The input power supply from the VRM 20 is provided to the PCB, and routed in turn via the package 55 to the die 60 for supply to the various integrated circuit components provided on the die.

Figure 2B:
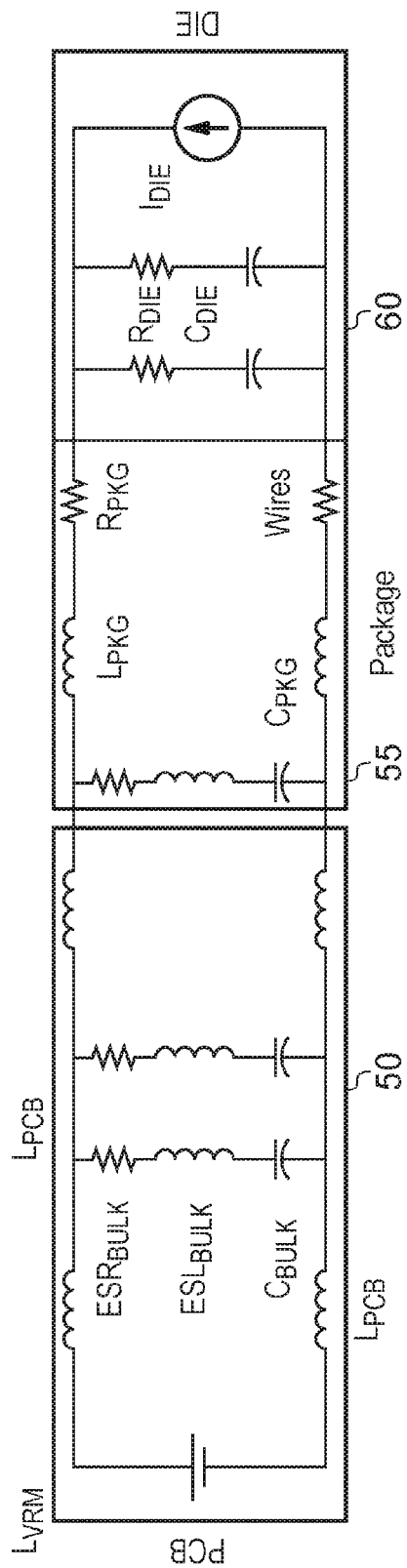

FIG. 2B illustrates various inductive and capacitive components within the PCB 50, package 55 and die 60 that can contribute to the observation of impedance peaks at certain resonant frequencies. In FIG. 2B, the various switching transistors on the die are considered together and illustrated as a current source $I_{DIE}$. Explicit on-die decoupling capacitors and non-switching transistors act as local charge reservoirs that are illustrated by the capacitor $C_{DIE}$. The power-line traces on the package and board are represented using R-L networks. Discrete decoupling capacitors on the package ($C_{PKG}$) and the bulk capacitors on the PCB ($C_{BULK}$) are illustrated as capacitors in series with their effective series resistance (ESR) and inductance (ESL).

Figure 3:
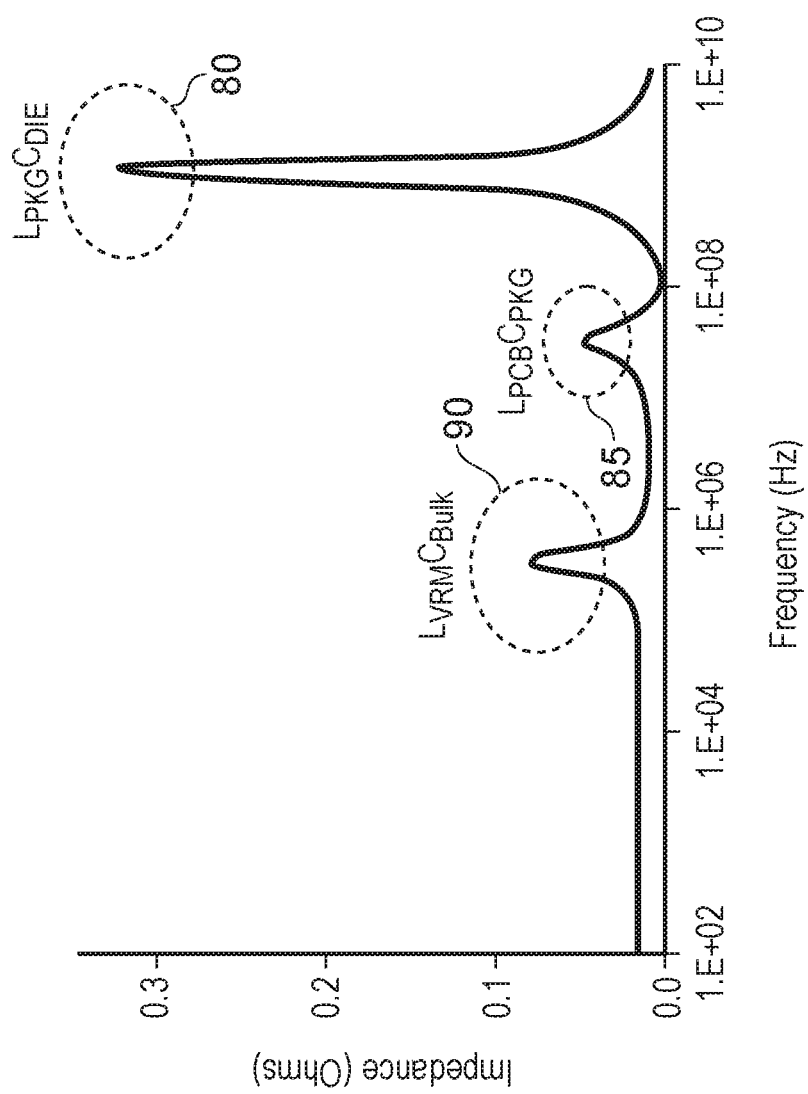
FIG. 3 is a graph illustrating impedance peaks occurring at certain resonant frequencies within the power delivery network of one embodiment.
Figure 4:
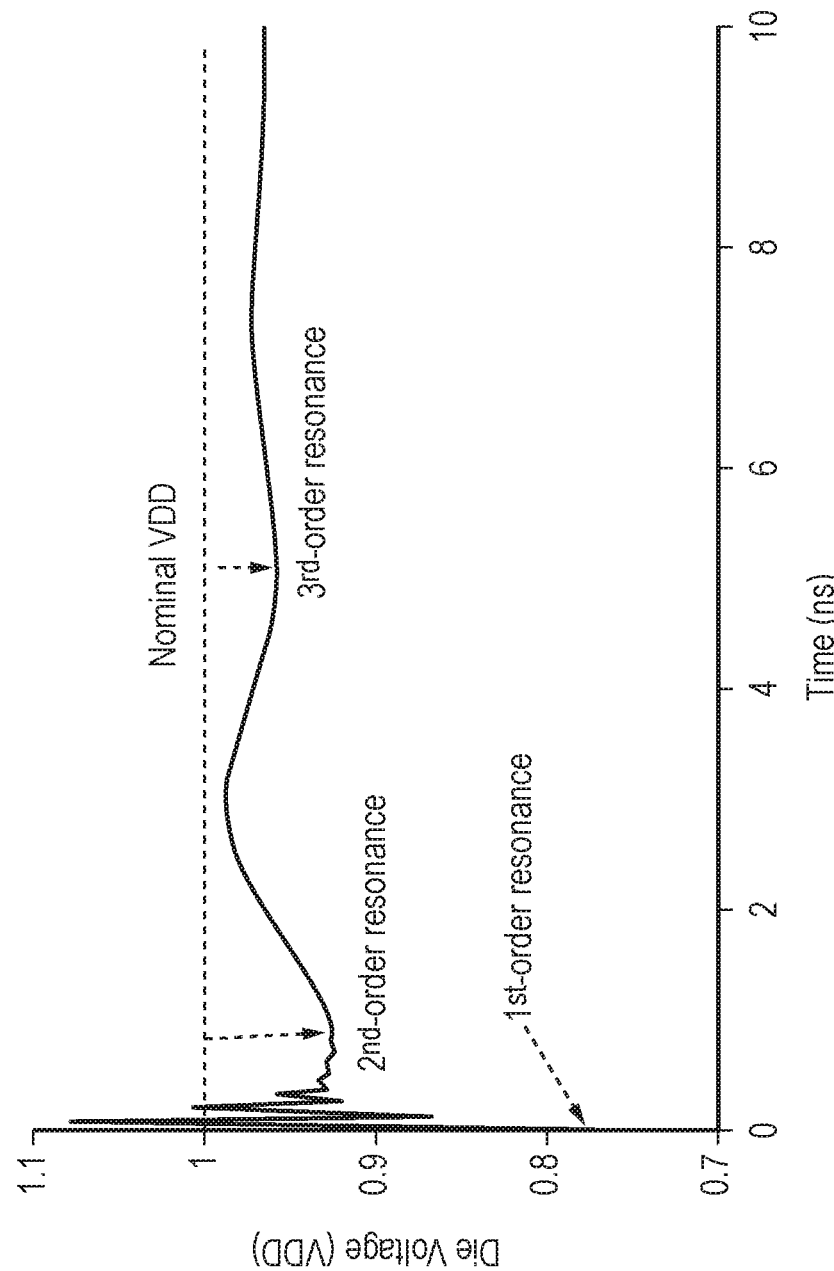
FIG. 4 illustrates a step-current response of the supply voltage provided by the power delivery network of one embodiment.

FIG. 3 shows the PDN input impedance as seen from the die as a function of frequency for the simplified PDN shown in FIG. 2B. The impedance spectrum shows three distinct impedance peaks due to each capacitor resonating with its counterpart inductor. The highest impedance peak, referred to as the first-order resonance, also occurs at the highest frequency (in this example approximately 100 MHz), and is due to the resonance between the die capacitance and the package inductance. The second and third-order resonances are due to downstream capacitor networks, and occur at relatively lower frequencies (approximately 1 MHz and 10 KHz for the second and third order resonances, respectively). Certain micro-architectural events within components of the integrated circuit, such as for example pipeline interlocks, cause current-step excitations that exercise the three predominant system resonance frequencies within the PDN, as shown by way of example in FIG. 4. As shown, these various resonant frequencies cause droops in the supply voltage, with the maximum magnitude of the voltage droop being caused by the first order resonance, which as such dominates the total timing margin.

It is hence clearly desirable to know where these resonant frequencies are in order to apply suitable margining when operating the apparatus. A shift in the actual resonant frequency can be indicative of a fault in the PDN that can lead to high impedance peaks differing from those that the system was designed for. These impedance peaks due to the faulty PDN can give rise to higher voltage drops leading to significant performance impacts within the apparatus, for example giving rise to occasional timing faults during operation due to insufficient timing guard bands being provided.

Figure 5:
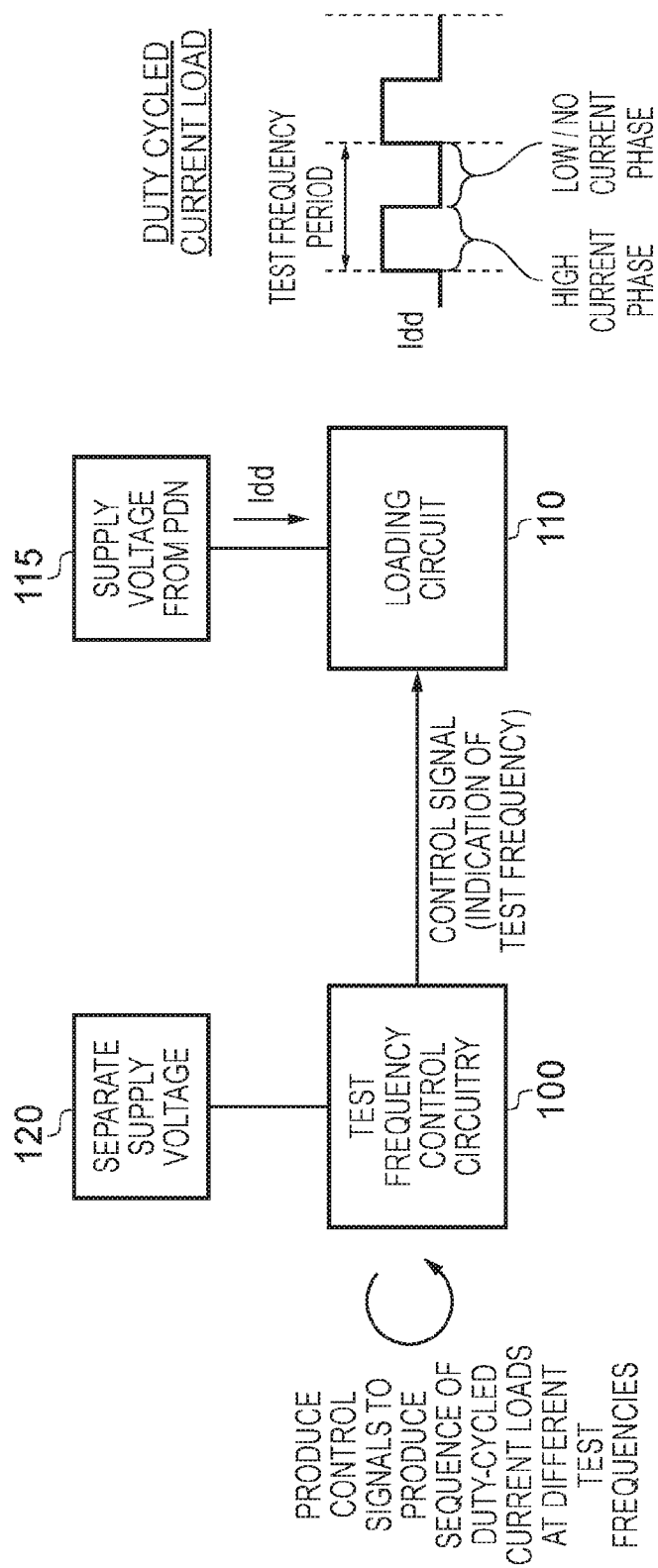
FIG. 5 is a block diagram illustrating the operation of the resonant frequency detection circuitry of FIG. 1 in accordance with one embodiment.

As mentioned earlier, in accordance with the described embodiments, resonant frequency detection circuitry 35 can be provided within the apparatus to enable in-situ detection of the resonant frequencies of the PDN, for example during a manufacturing test or for in-field diagnostics. FIG. 5 illustrates the basic operation of the resonant frequency detection circuitry in accordance with the described embodiments. The resonant frequency detection circuitry 35 essentially consists of a test frequency control circuit 100 and a loading circuit 110. The loading circuit 110 operates from the supply voltage 115 provided by the PDN and, when enabled, draws current through the PDN. In particular, under the control of the test frequency control circuit 100, the loading circuit is caused to draw a duty-cycled current load through the PDN at a test frequency indicated by the test frequency control circuit 100. In particular, the test frequency control circuitry 100 issues one or more control signals to the loading circuit that provides an indication of the required test frequency, and the loading circuit then operates as shown in FIG. 5 to draw a duty-cycle current load that oscillates at the desired test frequency. In particular, during each test frequency period the loading circuit will draw a relatively high current load for one phase of the period and a relatively low, or in some embodiments no, current load during a further phase of the period. In the embodiment shown the high current phase is in the first part of the test frequency period and the low/no current phase is in the latter part of the test frequency period, but in an alternative embodiment these phases may be reversed. As a result of operating the loading circuit in this manner, it can be seen that a specific frequency can be associated with the current drawn through the PDN, and if that frequency aligns with one of the earlier mentioned resonant frequencies of the PDN, this will cause an impedance peak which will in turn cause a drop in the supply voltage.

In the described embodiments, the operation of the loading circuit produces a measurable property whose value varies in dependence on the supply voltage, and accordingly when the supply voltage drops due to such a resonant frequency being excited, that will be reflected in the observed value of the measurable property produced as a result of operating the loading circuit in the above described manner.

Accordingly, by causing the test frequency control circuitry to sweep through a sequence of different test frequencies (as mentioned earlier the order in which the test frequencies are included within the sequence is in one embodiment not important), the profile of the measurable property can be observed, and local extrema in the observed values will then be indicative of occurrences of impedance peaks. For each such local extrema, the test frequency that resulted in that extrema being observed indicates the resonant frequency of the PDN.

The measurable property can take a variety of forms. For example, in one embodiment as will be discussed later with reference to FIG. 8, the resonant frequency detection circuitry 35 may itself produce the measurable property, for example in the form of a count value accumulated over a fixed time interval, with variation in the count value being observed across the various test frequencies in order to detect the resonant frequencies. In an alternative embodiment, it has been found that, due to the operation of the loading circuit, certain pre-existing measureable properties will produce values that vary in dependence on the supply voltage in a manner that enables local extrema in the values of that measurable property to identify the resonant frequencies. In one particular embodiment, it has surprisingly been found that the average current drawn at the input to the PDN, which can readily be measured by an off-chip current monitor, will have such a property, and in particular the average current will drop when the duty-cycled current load of the loading circuit is operated at a frequency matching one of the resonant frequencies.

In one embodiment, the various control signals produced by the test frequency control circuitry are arranged not to vary with the supply voltage swing in the supply voltage output by the PDN. In one embodiment this can be achieved by filtering the PDN's power supply prior to provision to the test frequency control circuit. In an alternative embodiment, as shown in FIG. 5, a separate supply voltage 120 can be provided to the test frequency control circuit 100. Whilst in one embodiment this separate supply voltage will also be input via the VRM 20, it forms a dedicated supply voltage routed only to the test frequency control circuit, and accordingly can readily be kept as a clean supply that does not suffer from the supply voltage noise transients associated with the main power supply being provided by the PDN to the integrated circuit components such as the CPU 25. In one embodiment the test frequency control circuitry 100 further has a very high power-supply rejection ratio (PSRR).

Figure 6B:
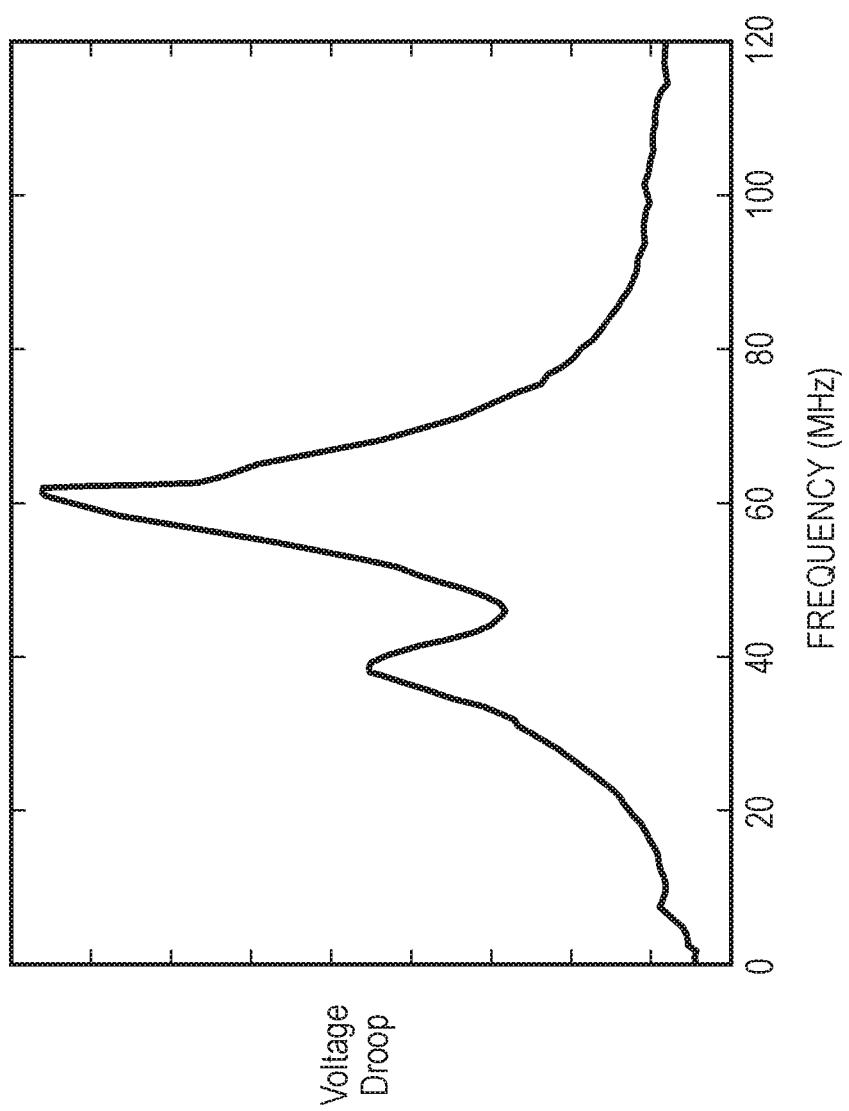
FIGS. 6B and 6C illustrate an associated voltage droop in the supply voltage from the power delivery network, and a corresponding impedance profile for the power delivery network.
Figure 6C:
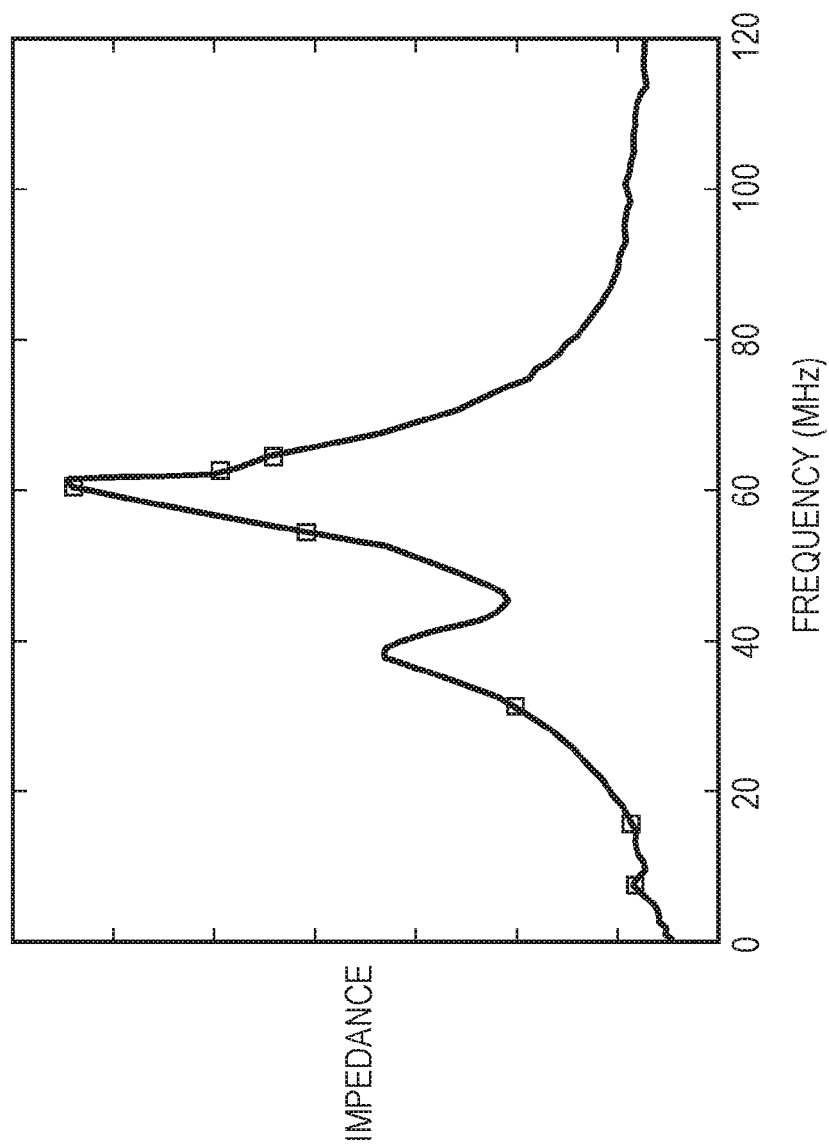

FIG. 6A schematically illustrates the profile of the measured property that may be observed when the loading circuit 110 is operated in the above described manner for a sequence of test frequencies. As shown, certain local minima can clearly be observed, and the test frequency associated with each of those local minima then directly provides an indication of a resonant frequency of the PDN. As mentioned earlier, in one embodiment the measured property may be an average current measurement taken at the input to the PDN, whilst in another embodiment it can be an on-chip value produced directly by the resonant frequency detection circuitry, such as a count value which drops as the voltage droops. FIGS. 6B and 6C illustrate the associated voltage droop of the supply voltage output by the PDN to the various integrated circuit components, and the impedance within the PDN, at various frequencies, respectively. As shown, when the test frequency matches a resonant frequency, the peak-to-peak supply voltage noise increases due to an increase in the impedance of the PDN.

Figure 7B:
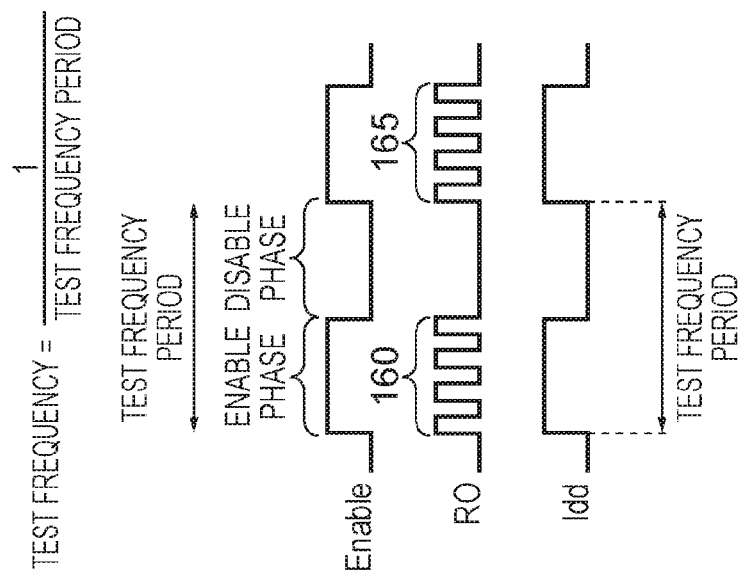
FIGS. 7A and 7B illustrate a resonant frequency detection circuit in accordance with one embodiment.
Figure 7A:
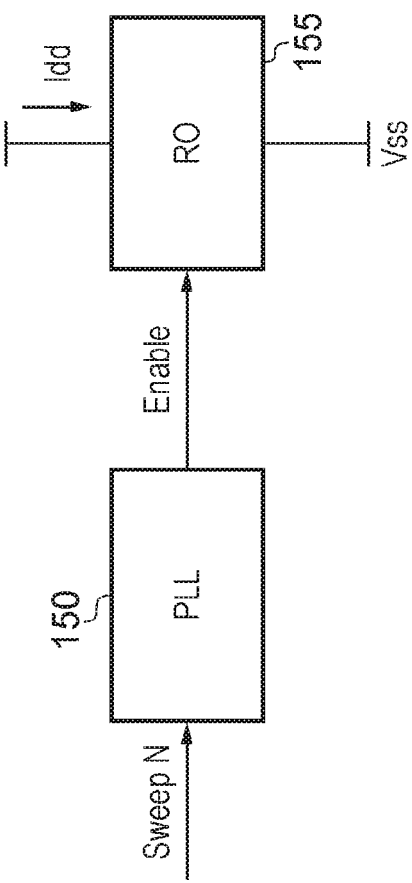

FIG. 7A illustrates a particular example embodiment of the resonant frequency detection circuitry, where the test frequency control circuitry 100 of FIG. 5 takes the form of a phase-locked loop (PLL) circuit 150, and the loading circuit 110 of FIG. 5 takes the form of a ring oscillator circuit 155. The PLL can be controlled by a sequence of integer values to generate a corresponding sequence of control signals, each control signal providing a periodic enable signal that repeats at an associated test frequency. In particular, as shown in FIG. 7B, the periodic enable signal has an enable phase and a disable phase during each test frequency period, with the ring oscillator circuit 155 being turned on during the enable phase and being turned off during the disable phase. This gives rise to a duty-cycled current load as shown in FIG. 7B that tracks with the enable signal. In particular, in this embodiment the ring-oscillator draws a current load during the enable phase while it is turned on, and then draws negligible current during the disable phase, when it is turned off. Accordingly, the ring oscillator can be seen to draw an AC current through the PDN at a test frequency controlled by the PLL.

In one embodiment, the ring oscillator frequency, when enabled, is sufficiently higher than the frequency at which the ring oscillator is turned on and off by the enable signal to enable multiple oscillations of the ring oscillator to occur within each enable phase, as shown schematically by the sequence of oscillations 160, 165 shown in FIG. 7B. In one embodiment, a fairly short ring oscillator that oscillates at around 3-5 GHz has been found to provide a suitable sequence of oscillation signals, when used in combination with a PLL that produces a sequence of enable signals that repeat at a frequency in the range of 50-200 MHz.

As will be apparent from FIGS. 7A and 7B, the voltage droop half cycle is in phase with the enable phase of the ring oscillator. The period at which the ring oscillator oscillates is proportional to the reciprocal of the supply voltage, since the inverse of the delay of the logic gates of which it is composed varies linearly with voltage to the first order. In addition, the current drawn by the ring oscillator is a function of the oscillation frequency of the ring oscillator and the supply voltage. Accordingly, it is observed that as the test frequency encoded by the enable signal reaches a resonant frequency of the PDN, the frequency of oscillation of the ring oscillator drops, and also the load current drawn through the ring oscillator drops significantly. Hence, there are various measureable properties that will observe local minima when the ring oscillator is operated in the above manner, and in particular when the test frequency encoded by the enable signal matches a resonant frequency of the PDN.

Figure 8:
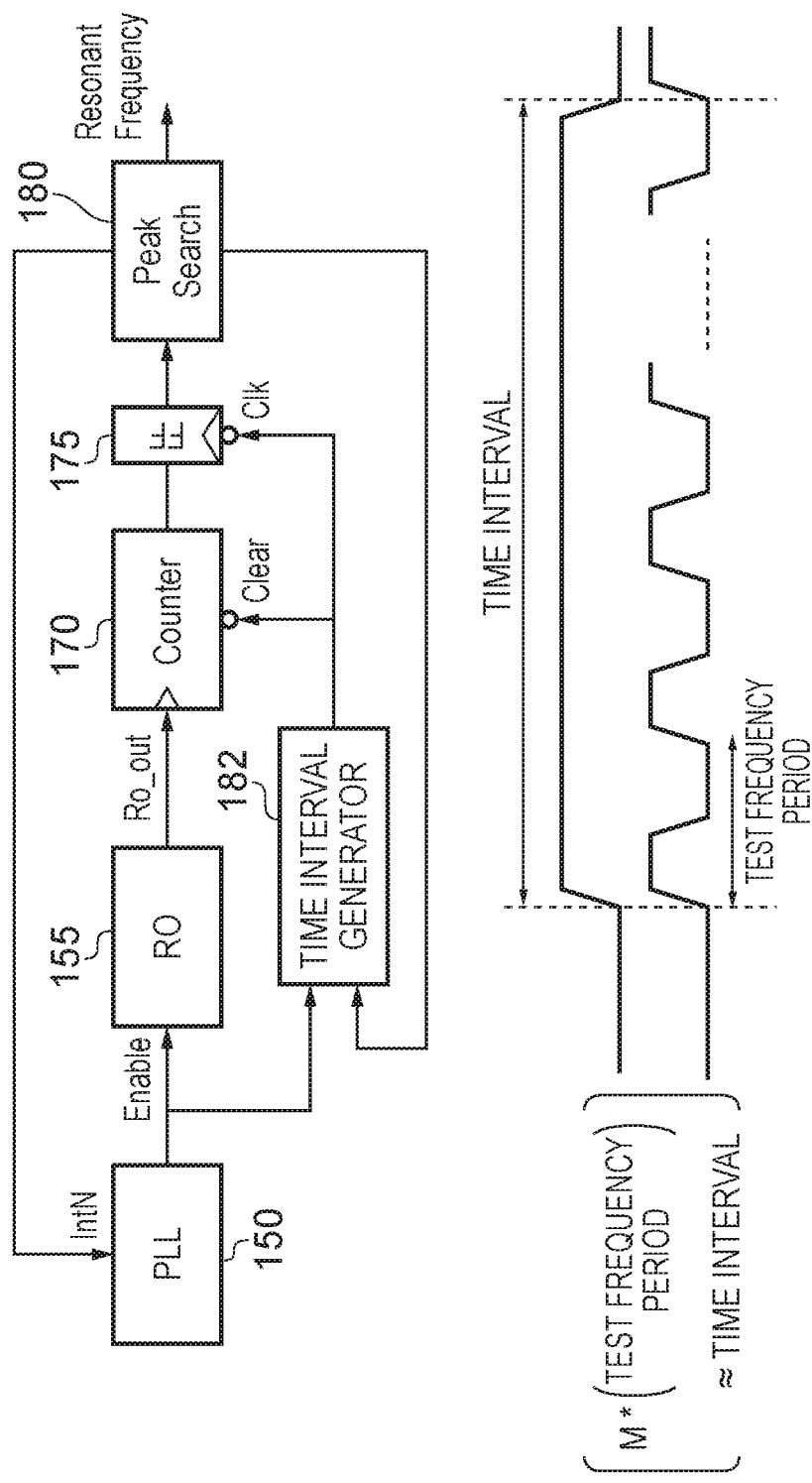
FIG. 8 illustrates a resonant frequency detection circuit in accordance with another embodiment.

FIG. 8 illustrates one example arrangement where the resonant frequency detection circuitry is supplemented with measurement circuitry so as to enable it to directly identify the resonant frequencies. In particular, in this embodiment, the output from the ring oscillator 155 is connected to a counter 170 which is connected in turn to a storage element such as a flip-flop 175. Peak search control circuitry 180 is arranged to control the input to the PLL, and hence control each test frequency, and is also arranged to receive the various count values as latched by the flip-flop, so as to build up a profile of the count values as the test frequency is changed. The peak search control circuitry can also be arranged to control the number of cycles of the PLL clock over which the counter is enabled by the time interval generator 182 to count the oscillator output. The integral number of cycles (denoted by "M") of the PLL clock for each test frequency is generated such that the time interval of counting remains effectively constant for each test frequency. Of course, this approach creates an error in generating the time interval specifically when the interval is not an exact integral multiple of the test frequency period. Hence, it is desirable to keep the time interval sufficiently long such that there are multiple cycles of test frequency period, thereby minimizing the error due to this mismatch. By this approach, the peak search circuit 180 can be arranged to sweep the PLL output frequency through a sequence of test frequencies in a region of interest. At each test frequency, the number of oscillations in the ring oscillator's output is counted by the count circuitry 170, over a fixed time interval. At the end of each time interval, the flip-flop 175 latches the count value and the counter 170 is again reset for a subsequent test frequency. That count value is then provided to the peak search circuit 180. It is to be noted that since the time interval for counting is kept effectively constant for each test frequency, therefore, the count thus generated is directly proportional to the oscillator frequency. Hence, comparison of the count values translates to a direct comparison of oscillator frequency values.

This arrangement takes advantage of the property that the ring oscillator slows down when the supply voltages sags in phase, and accordingly local minima in the count value profile will directly indicate the presence of a resonant frequency. At this point, the peak search circuit identifies that a resonant frequency is equal to the test frequency that gave rise to that local minima in the count value. Hence, it can be seen that the ring oscillator frequency acts as a direct proxy for the impedance of the PDN.

As is further apparent from the above discussion of FIG. 8, since the ring oscillator is duty-cycled (in one embodiment it is only enabled 50% of the time as shown for example in FIG. 7B), it is readily possible to incorporate clearing of the counter in between measurements.

Such an approach has the benefit that it can be implemented as simple on-chip circuitry and does not require any external test equipment. It is also not necessary to have any dedicated pins within the apparatus that might otherwise be necessary in order to measure the supply voltage swing off-chip.

Figure 9:
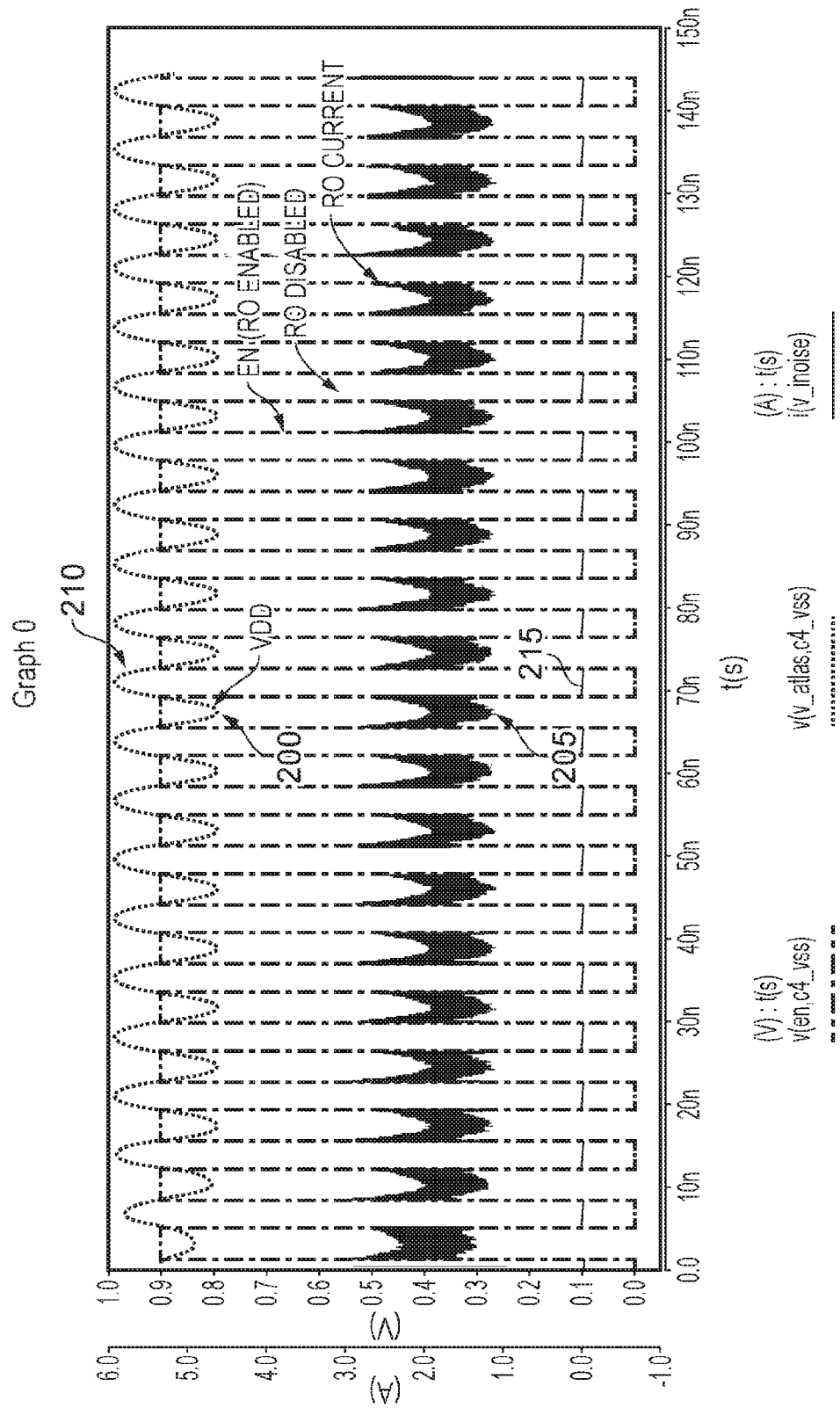
FIG. 9 is a graph showing oscillations in the supply voltage, and associated current drain, when the ring oscillator of FIG. 7A is enabled at a frequency that matches a resonant frequency of the power delivery network, in accordance with one embodiment.

FIG. 9 is a graph that shows supply voltage oscillations as the ring oscillator is enabled at a frequency that matches a resonant frequency within the PDN. As is shown in FIG. 9, the voltage droop half-cycle is in phase with the enabled phase of the ring oscillator. Hence, during the voltage droop 200, there is an associated droop in the current drawn, as shown by the reference numeral 205. However, during the corresponding peak half-cycle of the voltage swing, the ring oscillator is disabled, and is consuming negligible current, as shown by the reference numeral 215. By virtue of this observation, it has been realised that it is possible to detect resonant frequencies by observing the average current consumption when the ring oscillator or an equivalent loading circuit is operated in the above described manner to draw a duty-cycled current load at a variety of different test frequencies. In particular, rather than any current variations being averaged out, droops in the average current consumed at certain frequencies can readily be observed, and hence the average current consumption can be used to directly identify the locations of the resonant frequencies. Accordingly, such an approach enables the ready availability of other measured properties from which the resonance frequencies can be derived. For example, the average current profile as observed at the input to the PDN, which can readily be observed by an off-chip current detection circuit, will exhibit droops in the average current consumption aligned with the resonant frequencies excited by the loading circuit.

Whatever form the measurable property takes, it is desirable to ensure that the value of the measurable property taken is reliable. In one embodiment, power supply oscillations due to the duty-cycled current load build up over time until they lead to sustained oscillations. In practice, it is beneficial if measurement of the measurable property takes account of the fact that sustained oscillations take some time to build up.

In one embodiment this is achieved by ensuring that the disable phase of the enable signal from the PLL 150 is long enough to allow the supply voltage to recover, and then to operate the apparatus at a particular test frequency for multiple cycles of the enable signal, in order to allow an averaging effect to be applied to the observed values of the measurable property. For instance, when considering the example of FIG. 9, it can be seen that the RO current for the first two cycles is not as low as it is in later cycles, indicating that the supply voltage droop is not fully developed. In one embodiment, this effect can be minimized by taking an average of the value of the measurable property over multiple cycles, for example for 20 cycles as shown in FIG. 9.

However, in other embodiments different approaches can be taken to obtain a good "average" value for the measurable property at a particular test frequency. For example, the values of the measurable property obtained for two successive PLL cycles could be compared, and the PLL cycles continued until the difference between successive samples of the measurable property becomes negligible or lower than a predetermined error threshold. When there is no longer any substantial difference between the values of the measurable property for two successive cycles, this can then be interpreted as indicating that the current value is the required averaged value.

Alternatively, initial readings of the value of the measurable property may be discarded such that the measurement of the average value does not suffer from error due to initial oscillation buildup. An average can then be taken over a fewer number of PLL cycles.

In a yet further approach, the value of the measurable property could be taken after waiting for sufficient time for the oscillations to build up. At this point a discrete reading of the value of the measurable property could be taken or instead an average could be taken over several PLL cycles. In practice, this waiting period has been found to be quite small, and in one embodiment is of the order-of 3 to 4 cycles of the test frequency. For instance, for a 100 MHz value of the test frequency, this waiting period therefore translates to 30 ns-40 ns.

Whilst in the above described embodiments of FIGS. 7A and 8 the loading circuit takes the form of a ring oscillator, in alternative embodiments the loading circuit can take a different form. For example, in FIG. 10 the loading circuit 250 takes the form of a shorting circuit that can temporarily create a shorting path between the supply voltage and ground through the PMOS transistor 265 and the NMOS transistor 270, under the control of the enable signal issued by the PLL 150. A "TEST_ENABLE" input to the AND gate 255 allows the loading circuit to be turned off if desired, hence preventing any possibility of a shorting path being created unintentionally. However, during a test process where it is desired to use the loading circuit, the "TEST_ENABLE" signal is held high, and accordingly the output from the AND gate 255 oscillates in dependence on the oscillation of the enable signal from the PLL circuit 150. As a result, it can be seen that during an enable phase of the test frequency period, a large current is drawn by the loading circuit due to the transistors 265 and 270 being turned on, creating a shorting path, whilst during the disable phase negligible current is drawn, since both transistors are turned off. Accordingly, such a circuit creates a duty-cycled current load at the test frequency. As a result, this gives rise to a measurable property that can be observed to identify the locations of the resonant frequencies, for example using the average current consumption at the input to the PDN as discussed earlier.

Figure 10:
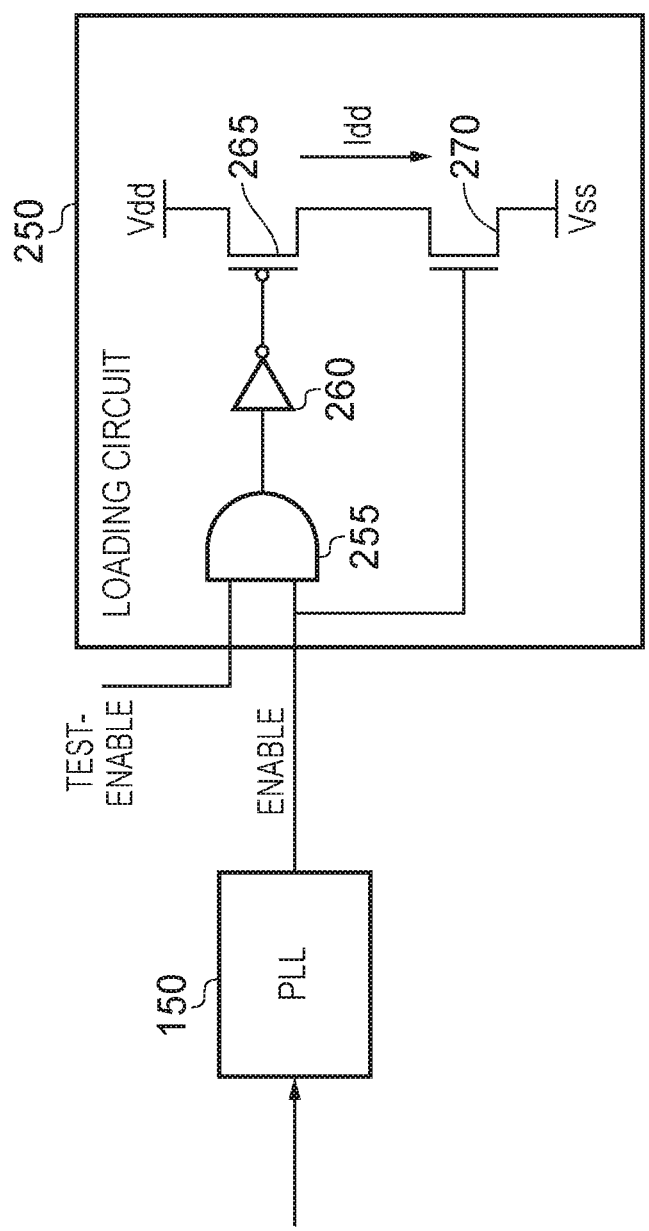
FIG. 10 is a diagram illustrating a resonant frequency detection circuit in accordance with an alternative embodiment.
Figure 11A:
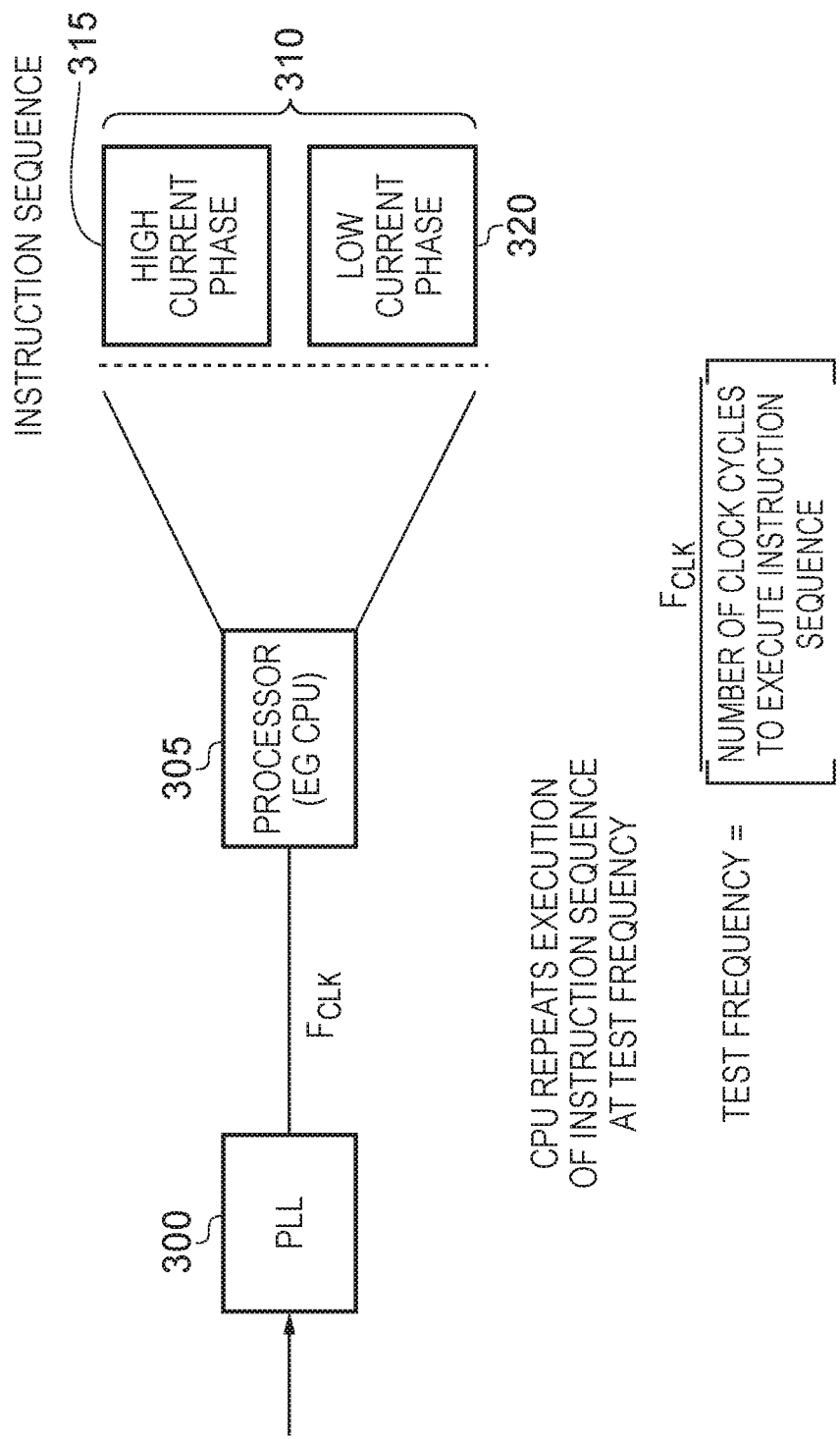

In the above described embodiments of FIGS. 7A, 8 and 10, the loading circuit takes the form of dedicated digital circuitry specifically provided for the resonant frequency detection process. However, in another embodiment it is possible to cause existing components within the integrated circuit to operate in a manner which gives rise to a duty-cycled current load at a test frequency controlled by the PLL. One such example is shown in FIG. 11A, where the PLL 300 produces an operating clock frequency for a processor 305, which may for example be a CPU or a GPU. During the test process, the processor is arranged to repetitively execute a predetermined instruction sequence 310, where the instructions have been chosen so as to provide a high current phase 315 and a low current phase 320 when those instructions are executed on the processor. In particular, during the high current phase, execution of the instructions will cause a relatively high current to be drawn by the processor 305, while during the low current phase execution of the associated instructions will cause a relatively low current to be drawn by the processor. The clock frequency output by the PLL is in this instance not directly providing the test frequency, but instead the test frequency is related to the clock frequency in dependence on the number of clock cycles it takes to execute the instruction sequence. In particular, the test frequency is equal to the clock frequency divided by the number of clock cycles to execute the instruction sequence, and hence it can be seen that the instruction sequence is repeated at the test frequency, and accordingly a duty-cycled current load is drawn by the processor at the test frequency. This is illustrated by the timing diagram of FIG. 11B. Accordingly, this again gives rise to an operation of the circuitry such that the measurable property will have local minima observable at frequencies which match the resonant frequency of the PDN, and accordingly measurement of a property such as the average current consumed at the input to the PDN can again be used to detect the resonant frequencies.

Figure 12:
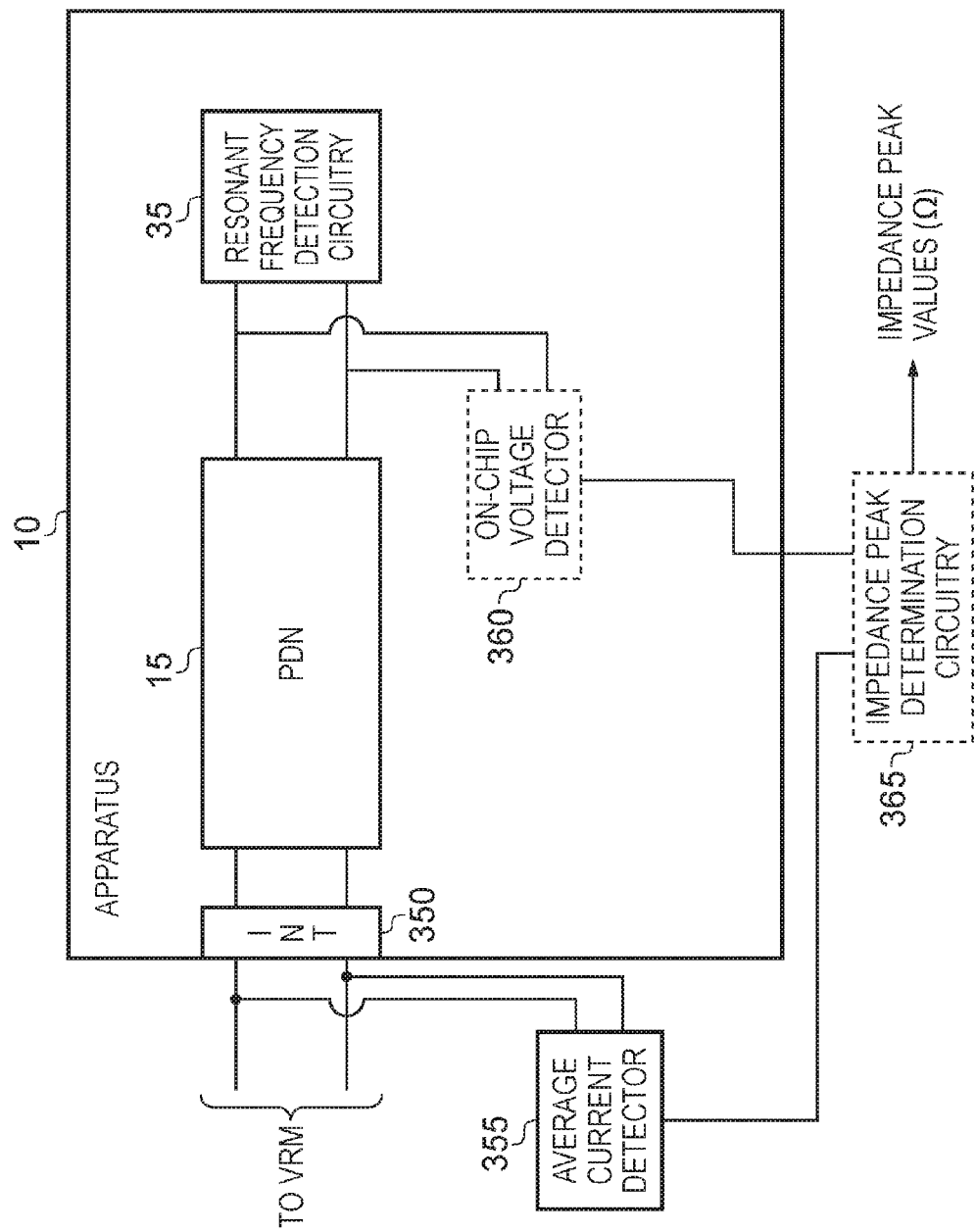
FIG. 12 illustrates an embodiment where the measured property produced as a result of operating the resonant frequency detection circuit of the described embodiments is an average current measurement taken at an input of the power delivery network.

FIG. 12 is a diagram illustrating how an average current detector 355 can be connected to an interface 350 coupled to the input of the PDN 15, allowing the average current to be measured whilst the resonant frequency detection circuit 35 is operated in the above described manner to draw a duty-cycled current load at a variety of different test frequencies. Each local minima in the observed average current can then be mapped to the test frequency which gave rise to that minima, with that test frequency then being indicative of the corresponding resonant frequency within the PDN.

In one embodiment, as also shown by the dotted boxes in FIG. 12, additional components can be provided so as to enable evaluation of the actual impedance peak corresponding to each resonant frequency. In particular, an on-chip voltage detector 360 may be provided to produce values indicative of variation in the supply voltage. In particular, the on-chip voltage detector may produce output values that track with variation in the supply voltage, with those values then being combinable with the nominal supply voltage to provide an actual indication of the variation in the supply voltage as output by the PDN 15 to components of the integrated circuit. That information can be provided to an impedance peak determination circuitry 365 (which in one embodiment may also be provided on-chip) which can also be provided with the average current measurements from the average current detector 355. By scaling the average current values measured by the detector 355, it is possible to produce an estimation of the average current drawn at the output of the PDN, and then by combining that information with the voltage information from the on-chip voltage detector 360 it is possible to evaluate the magnitude of the impedance within the PDN, and in particular the values of the impedance at the various impedance peaks.

The on-chip voltage detector 360 can take a variety of forms, but in one embodiment may take the form of the circuitry described in commonly owned, co-pending U.S. patent application Ser. No. 14/081,900, the entire contents of which are hereby incorporated by reference. One particular example of such on-chip voltage detection circuitry is shown in FIG. 13.

Figure 13:
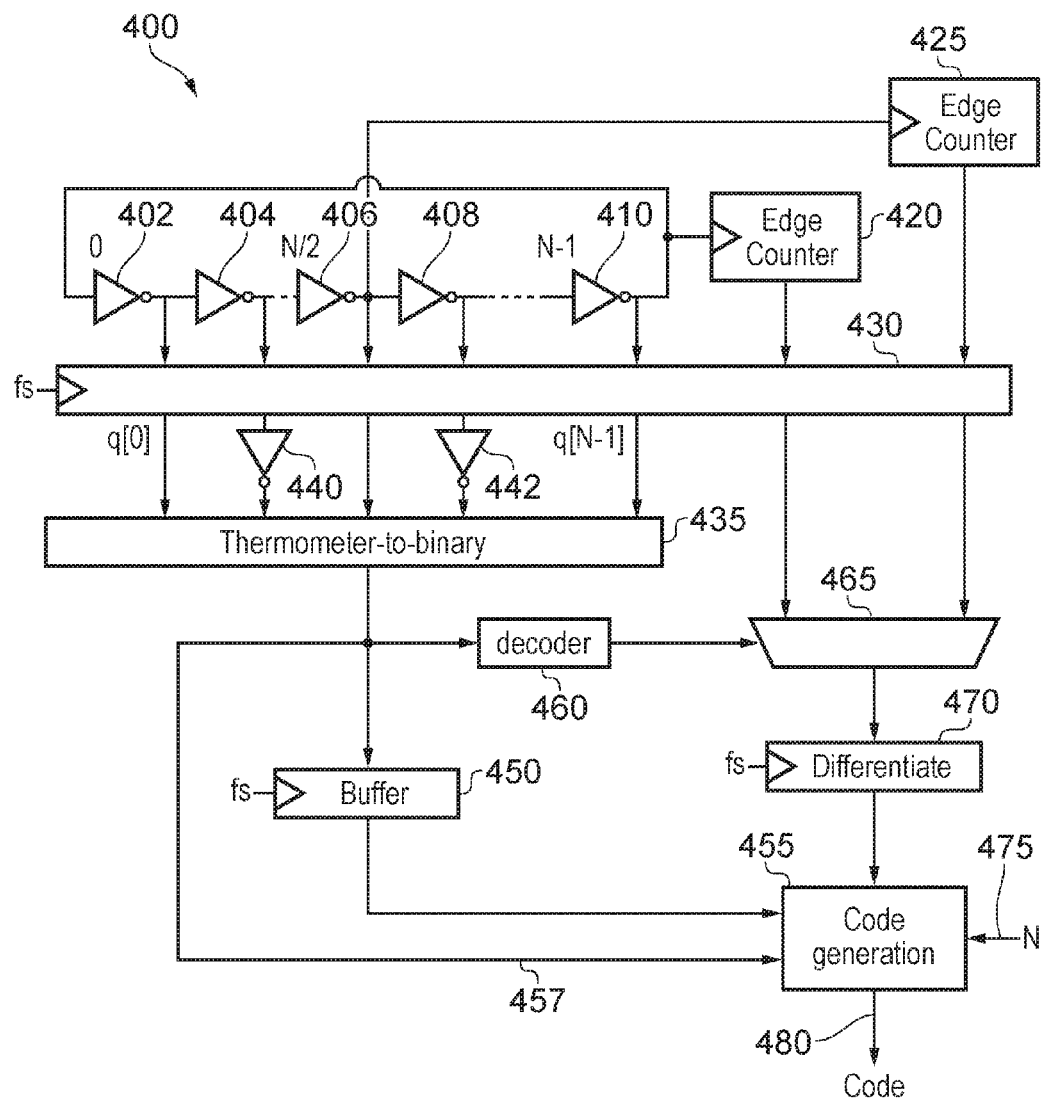
FIG. 13 illustrates an example circuit that may be used to implement the on-chip voltage detector of FIG. 12 in accordance with one embodiment.

In particular FIG. 13 illustrates the arrangement of a circuit delay monitoring apparatus that can be used to implement the on-chip voltage detector 360 in one embodiment, where two edge counters are used, and a mechanism is provided for deciding at any particular point in time which edge counter's output is safe to use when generating a count indication for the reference time period. From the count indications, and the nominal supply voltage, indication of variation in the supply voltage can be generated.

As shown in FIG. 13, a ring oscillator 400 consists of a plurality of delay elements 402, 404, 406, 408, 410, in this embodiment the delay elements being formed of inverters. Two edge counters 420, 425 are connected to associated locations within the ring oscillator, in this embodiment those locations being essentially evenly spaced from each other within the ring oscillator. In practice, due to there being an odd number of delay elements within the ring oscillator, they will not be exactly separated by half the ring oscillator length. A series of sampling circuits 430 are provided, in one embodiment the sampling circuits including a series of flip flops controlled by a clock signal fs. A series of sampling points are provided, one in association with the output of each of the delay elements 402, 404, 406, 408, 410, with those sampling points providing an input to associated flip flops within the sampling circuitry 430.

A series of flip flops configured to receive the outputs from the sampling points can be considered to form fine sampling circuitry used to sample the signal value at each of the sampling points, with that sampled information then being used to generate an indication of the current location of the signal transition within the ring oscillator. In particular, the output of each of those flip flops is passed to the thermometer-to-binary circuitry 435, with the output from each alternate flip flop being passed to an inverter 440, 442. Hence, the input to the thermometer-to-binary circuitry 435 will be a binary string of bits, where a first sequence of the bits has a first value, and a second sequence of bits then has the opposite value. The position of the transition between those two sequences then indicates a current location of the signal transition within the ring oscillator. The thermometer-to-binary 435 can then convert that thermometer value into a more compact binary encoding to be output representative of the current location of the signal transition.

As shown in FIG. 13, this output code is provided to a buffer 450, and also to the decoder 460. The decoder 460 determines based on the output from the thermometer-to-binary circuitry 435, and knowledge of the locations at which the edge counters 420, 425 are connected into the ring oscillator, which edge counter is furthest from the current location of the signal transition, and issues a control signal to the multiplexer 465 accordingly.

Flip flops within the sampling circuitry 430 form part of coarse circuitry to sample the outputs of each of the edge counters 420, 425, under the control of the clock signal fs. The sampled outputs are then provided as inputs to the multiplexer 465. Based on the control signal received via the decoder, one of those input signals will be output to the differentiation circuitry 470.

In the embodiment illustrated in FIG. 13, the differentiation circuitry 470 includes some local buffering circuitry to buffer the previously received input from the multiplexer 465 and is arranged to resample the output from the multiplexer 465 in dependence on the clock signal fs. In this embodiment, it is assumed that each of the edge counters 420, 425 is initialised to the same value, and hence the differentiation logic 470 can merely subtract a currently sampled count value from the previously sampled count value in order to determine a change in the count value that has occurred in a referenced time period, in this embodiment it being assumed that the reference time period is the period between two corresponding edges of the clock signal fs, for example between two rising edges of the clock signal. The change in the count value as determined by the differentiation circuitry 470 is then provided to the code generation circuitry 455.

As shown in FIG. 13, the code generation circuitry 455 also receives the current output from the thermometer-to-binary circuitry 435, along with the output from the buffer 450 representing the previously received output from the thermometer-to-binary circuitry 435. Based on the current output from the thermometer-to-binary circuitry 435 received over path 457, and the output from the buffer 450, the code generation circuitry can determine a difference indication, in particular this representing the number of delay elements over and above any full laps of the ring oscillator traversed by the signal transition in the referenced time period.

The code generation circuitry 455 also receives the value N over the path 475, i.e. an indication of the number of delay elements in the ring oscillator 400. Based on this information, the code generation circuitry 455 can then generate an output code over path 480 indicative of the total number of delay elements traversed by the signal transition in the reference time period.

The computation performed by the code generation circuitry 455 will depend on the current location of the signal transition as indicated over path 457, the previous location of the signal transition as indicated by the output from the buffer 450, and the location at which the selected edge counter is located within the ring oscillator. In particular, if the location of the selected edge counter does not lie in the path of the signal transition between the previous location of the signal transition and the current location of the signal transition, then the difference between the current and previous locations of the signal transition is added to an intermediate result obtained by multiplying the output from the differentiation circuitry 470 by the value N. The resultant value is output as a code over path 480, and indicates the total number of delay elements traversed by the signal transition in the reference time period.

However, if the location of the selected edge counter does lie between the previous location of the signal transition and the current location of the signal transition in the direction of travel of the signal transition, then in one embodiment the code generation logic subtracts one from the value output from the differentiation circuitry 470, before multiplying the resultant value by N. This produces an intermediate result which is N less than would be the case had the output from the differentiation circuitry 470 been used directly. With this adjustment, then the difference between the current location and the previous location of the signal transition can be added to the resultant intermediate value in order to produce an output code over path 480 which represents the total number of delay elements traversed by the signal transition in the reference time period.

Figure 14A:
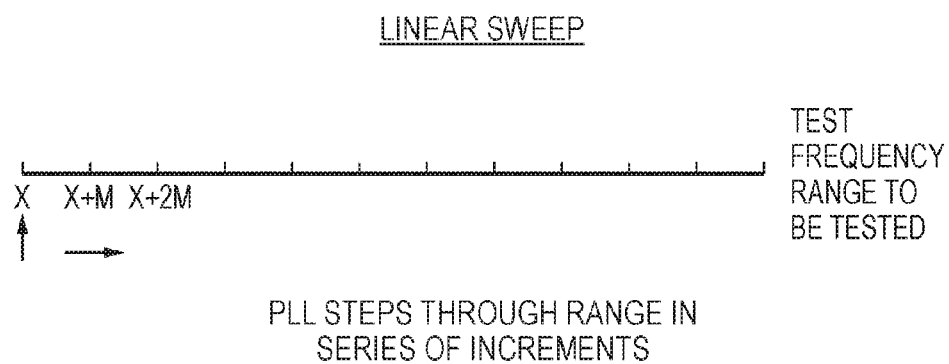
FIGS. 14A and 14B illustrate alternative sweep mechanisms that may be used to control the operation of the test frequency control circuitry of the resonant frequency detection circuitry in accordance with one embodiment.

The manner in which the test frequency control circuitry 100 is arranged to sweep through the various test frequencies (and hence the order in which the test frequencies appear in the sequence of test frequencies) can take a variety of forms. For example, as illustrated in FIG. 14A, a linear sweep may be performed where a range of test frequencies is determined, and the test frequency control circuitry then steps through that range in a linear manner, with the loading circuit then drawing a duty-cycled current load at each test frequency. In an alternative embodiment, the test frequency control circuitry may not step through the range in a linear manner, and instead may adopt a different approach to select the order in which the test frequencies appear in the sequence. For example, in one particular embodiment the order in which the test frequencies are chosen may be random. For accuracy reasons, it may be appropriate to limit frequency steps to smaller increments to ensure that the error in measurement of the resonance frequency is correspondingly lower.

Figure 14B:
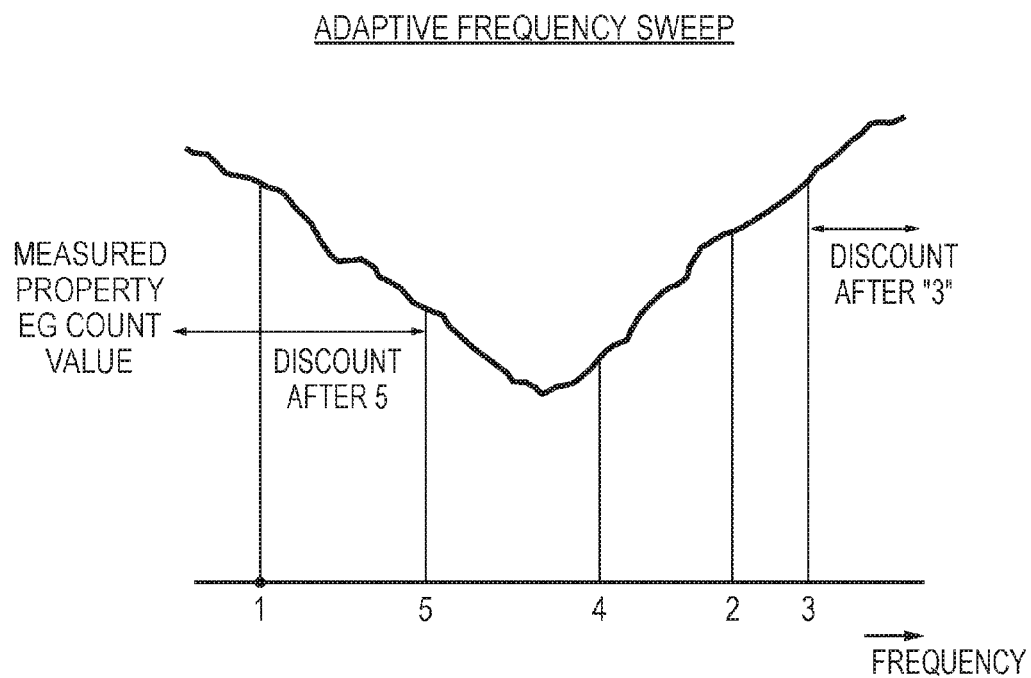

In a yet further alternative embodiment as shown in FIG. 14B, an adaptive frequency sweep may be performed, for example by using a first-order gradient search algorithm, with the aim of more quickly locating the resonant frequencies. In this example, it is assumed that the measured property will produce a local minima that corresponds to the location of a resonant frequency. The numbers 1 to 5 shown in FIG. 14B illustrate a particular ordering of test frequencies. Whilst the value of the measured property continues to decrease for increasing test frequencies, then the test frequencies continue to be increased. Hence, having performed the first test at the test frequency "1" and then a next test at the test frequency "2", given that the count value for the test frequency "2" is less than the count value for the test frequency "1", then the test frequency "3" is tested. However, at this point the count value has increased, and accordingly the process will now discount all test frequencies to the right hand side of test frequency "3". Test frequency "4" is tried next, and produces a count value which is decreasing, and accordingly the process proceeds to test frequency "5". However, at this point the count value has increased, and accordingly all test frequencies to the left of test frequency "5" are discounted. By such an approach, it can be seen that the process can relatively quickly hone in on a test frequency that matches a resonant frequency.

The above described embodiments provide a particularly efficient and cost effective mechanism for detecting resonant frequencies within a PDN of a manufactured apparatus. Some embodiments remove the requirement for any off-chip measurement equipment, any dedicated chip pins, or package and PCB traces. In some embodiments the required resonant frequency detection circuitry can be composed of solely digital static CMOS library standard cells. Further, some embodiments can combine stimulus and impedance detection into a single compact circuit. In some embodiments, the test frequency control circuitry can be provided by an existing PLL within the apparatus, which can readily be arranged to generate test frequencies that are independent of the supply voltage being measured, hence enabling the loading circuit to draw a duty-cycled current load at a variety of different test frequencies. Any resultant droops in supply voltage caused by the test frequency matching a resonance frequency, and hence triggering an impedance peak within the PDN, are readily observable from a variety of different measureable properties.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. An apparatus comprising:
a power delivery network to provide a supply voltage to components of the apparatus, the power delivery network having an impedance peak at at least one resonant frequency; and
resonant frequency detection circuitry comprising:
test frequency control circuitry to generate control signals to indicate a sequence of test frequencies; and
a loading circuit operating from said supply voltage, responsive to each test frequency indicated by the control signals, to draw a duty-cycled current load through the power delivery network at said test frequency, operation of the loading circuit producing a measurable property whose value varies in dependence on the supply voltage such that said at least one resonant frequency is determined from a variation in the value of said measurable property.

2. An apparatus as claimed in claim 1, wherein each resonant frequency is determined to be the test frequency that results in a local extrema in observed values of the measurable property.

3. An apparatus as claimed in claim 2, wherein said local extrema is a local minimum.

4. An apparatus as claimed in claim 1, wherein:
said loading circuit comprises ring oscillator circuitry; and
said test frequency control circuitry is arranged to generate, as the control signals for each test frequency in the sequence, a periodic enable signal for the ring oscillator circuitry that repeats at said test frequency.

5. An apparatus as claimed in claim 4, wherein the ring oscillator circuitry is arranged, when enabled, to generate an oscillating output signal at a frequency higher than the test frequency, and the resonant frequency detection circuitry further comprises measurement circuitry to generate said measurable property whose value is indicative of the frequency of the oscillating output signal.

6. An apparatus as claimed in claim 5, wherein the frequency of the oscillating output signal decreases as the supply voltage decreases, such that when the test frequency at which the enable signal is repeated aligns with one of said at least one resonant frequencies, the measurement circuitry detects a local minima in the measurable property.

7. An apparatus as claimed in claim 5, wherein the measurement circuitry is arranged to produce a count value indicative of the number of oscillations of the oscillating output signal occurring during a specified time interval.

8. An apparatus as claimed in claim 7, wherein the count value of the measurement circuitry is reset following said specified time interval.

9. An apparatus as claimed in claim 1, wherein:
said loading circuit comprises a shorting circuit which, when enabled, creates a shorting path between the supply voltage and a reference voltage; and
said test frequency control circuitry is arranged to generate, as the control signals for each test frequency in the sequence, a periodic enable signal for the shorting circuit that repeats at said test frequency.

10. An apparatus as claimed in claim 1, wherein:
said loading circuit comprises data processing circuitry to repeat execution of a sequence of instructions at said test frequency, execution of said sequence of instructions causing said duty-cycled current load; and
said test frequency control circuitry is arranged to generate, as the control signals for each test frequency in the sequence, an operating frequency for the data processing circuitry that causes the execution of the sequence of instructions to be repeated at said test frequency.

11. An apparatus as claimed in claim 1, further comprising an interface for connection of a current detector to an input of the power delivery network, and the measured property comprises an average current drawn at said input during operation of the resonant frequency detection circuitry.

12. An apparatus as claimed in claim 11, further comprising:

voltage detection circuitry to detect variation in the supply voltage during operation of the resonant frequency detection circuitry; and
impedance determination circuitry to determine values of the impedance peaks based on the variation in the supply voltage detected by the voltage detection circuitry and the average current observed via said interface.

13. An apparatus as claimed in claim 1, wherein said test frequency control circuitry is arranged such that the generated control signals are independent of variation in said supply voltage.

14. An apparatus as claimed in claim 13, wherein the test frequency control circuitry is operated from a further supply voltage separate from the supply voltage provided by the power delivery network.

15. An apparatus as claimed in claim 1, wherein the test frequency control circuitry comprises a phase-locked loop (PLL) circuit.

16. An apparatus as claimed in claim 1, wherein the components that operate from the supply voltage provided by the power delivery network are contained within an integrated circuit of the apparatus, and the resonant frequency detection circuitry is provided within the integrated circuit.

17. An apparatus as claimed in claim 1, wherein for each test frequency the test frequency control circuitry is arranged to cause the loading circuit to draw said duty-cycled current load for multiple cycles of the test frequency, and an averaging effect is applied to the value of the measurable property observed during said multiple cycles.

18. Resonant frequency detection circuitry for detecting a resonant frequency giving rise to an impedance peak in a power delivery network used to provide a supply voltage, comprising:
test frequency control circuitry to generate control signals to indicate a sequence of test frequencies; and
a loading circuit operating from said supply voltage, responsive to each test frequency indicated by the control signals, to draw a duty-cycled current load through the power delivery network at said test frequency, operation of the loading circuit producing a measurable property whose value varies in dependence on the supply voltage such that said resonant frequency is determined from a variation in the value of said measurable property.

19. A method of detecting a resonant frequency giving rise to an impedance peak in a power delivery network used to provide a supply voltage, comprising:
generating control signals to indicate a sequence of test frequencies;
operating a loading circuit from said supply voltage; and
responsive to each test frequency indicated by the control signals, operating the loading circuit to draw a duty-cycled current load through the power delivery network at said test frequency, operation of the loading circuit producing a measurable property whose value varies in dependence on the supply voltage such that said resonant frequency is determined from a variation in the value of said measurable property.

* * * * *